(12) United States Patent
Krishnamurthi et al.

(10) Patent No.: US 10,320,381 B2
(45) Date of Patent: Jun. 11, 2019

(54) REDUCED VSWR SWITCHING

(71) Applicants: Kathiravan Krishnamurthi, Westford, MA (US); Jean-Marc Mourant, Dunstable, MA (US); Olivier Hubert, Eterville (FR); Shawn Bawell, Amherst, NH (US)

(72) Inventors: Kathiravan Krishnamurthi, Westford, MA (US); Jean-Marc Mourant, Dunstable, MA (US); Olivier Hubert, Eterville (FR); Shawn Bawell, Amherst, NH (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 219 days.

(21) Appl. No.: 14/671,785

(22) Filed: Mar. 27, 2015

(65) Prior Publication Data
US 2016/0285447 A1 Sep. 29, 2016

(51) Int. Cl.
*H03K 17/16* (2006.01)
*H03K 17/693* (2006.01)
(52) U.S. Cl.
CPC ......... *H03K 17/693* (2013.01); *H03K 17/165* (2013.01)

(58) Field of Classification Search
CPC ........... H03H 7/40; H02J 5/005; H02H 17/00; H01Q 1/243; H01Q 1/38; H01Q 3/26; H01Q 3/247
See application file for complete search history.

(56) References Cited

U.S. PATENT DOCUMENTS

| | | | | |
|---|---|---|---|---|
| 2010/0039160 | A1* | 2/2010 | Ilkov | H03K 17/04123 327/374 |
| 2012/0256678 | A1* | 10/2012 | Sun | H01L 21/823878 327/434 |
| 2013/0015717 | A1* | 1/2013 | Dykstra | H03K 17/005 307/100 |
| 2015/0358015 | A1* | 12/2015 | Bawell | H01P 1/22 327/384 |

* cited by examiner

*Primary Examiner* — Sibin Chen
(74) *Attorney, Agent, or Firm* — Tracy Parris

(57) ABSTRACT

Sequenced switching mitigates impedance variations and signal reflections during switching events by stepping a switch incrementally through a sequence of different states from a start state to at least one intermediate state to an end state. Various architectures, sequencing and step control techniques may permit any degree of mitigation, including to the point of essentially eliminating impedance glitches. Sequential reconfiguration of the structure and/or parameters of one or more switch branches may permit simplification of related programming and circuitry while increasing the lifespan of components spared from unmitigated current and voltage spikes. Each switch branch being transitioned during a switch event may sequence differently than other branches based on the start state, end state and configuration of each branch.

20 Claims, 9 Drawing Sheets

REDUCED VSWR SWITCHING

CROSS-REFERENCE TO RELATED APPLICATIONS

This application is related to U.S. patent application Ser. No. 14/297,598, filed Jun. 5, 2014, entitled "Constant Impedance Switch," U.S. patent application Ser. No. 13/539,409, filed Jun. 30, 2012, entitled "Multi-Bit Cell Attenuator," and U.S. patent application Ser. No. 13/539,406, filed Jun. 30, 2012, entitled "Hybrid-Coding for Improving Transient Switch Response in a Multi-Cell Programmable Apparatus," which are non-provisional, utility patent applications hereby incorporated by reference in their entireties as if fully set forth herein.

TECHNICAL FIELD

The subject matter herein generally relates to switches. More particularly, the subject matter relates to reduced VSWR switching.

BACKGROUND

During switching events (e.g. hot switching), electronic switches may deviate from system characteristic impedance Zo. Impedance deviation may be referred to as an impedance glitch. A magnitude of impedance mismatch may be indicated by voltage standing wave ratio (VSWR), where a 1:1 VSWR indicates matched impedance and a VSWR higher than 1:1 indicates mismatch.

Impedance glitches slow down communication performance by temporarily disrupting data transmission and reception, pose reliability issues for numerous components and lead to a myriad of costs. Severe impedance glitches between system and switch ports during switching events may result in signal reflections and voltage and current stress that interrupt communication and/or limit the lifespan of switch components and components coupled to the switch.

Complex circuitry and/or programming are necessary to address problems caused by impedance glitches. Complex circuitry and programming incur design costs, production costs (e.g. by increasing die and circuit board area) and operating costs (e.g. by consuming power). As an example, a switch may be used to select one of several voltage-controlled oscillators (VCOs) to control a modulating frequency coupled to a system. During switching, the impedance glitch initially load-pulls the VCO being selected, which changes its output frequency and causes the phase locked loop (PLL) to unlock. When this occurs, the system is unable to communicate until the loop recovers. Sophisticated circuitry and/or firmware/software programming development are required to overcome these interruptions. In another example, switching glitches in switched-power amplifiers may be detrimental to performance or even cause damage if sophisticated circuitry and/or programming are insufficient to counteract the glitches.

Mitigation of impedance glitches may reduce switch and system design, fabrication and operating costs and may improve switch and system performance and reliability.

SUMMARY

This Summary is provided to introduce concepts in a simplified form. These concepts are described in greater detail below in the sections entitled Detailed Description Of Illustrative Embodiments, Brief Description of the Drawings, Claims, and in the figures. This Summary is not intended to identify key or essential features of the described or claimed subject matter, nor limit the scope thereof.

Sequenced switching mitigates impedance variations (e.g. glitches, spikes) and resulting signal reflections during switching events by stepping a switch incrementally through a sequence of different states from a start state to at least one intermediate state to an end state. Various architectures, sequencing and step control techniques may permit any degree of mitigation, including to the point of essentially eliminating impedance glitches. Sequential reconfiguration of the structure and/or parameters of one or more switch branches may permit simplification of related programming and circuitry while increasing the lifespan of components spared from unmitigated current and voltage spikes. Each switch branch being transitioned in a switch event may have its own sequence dependent on switch or branch start and end states. For example, a branch being transitioned from ON to OFF and another branch being transitioned from OFF to ON may have one or more impedance elements switched ON or OFF at different steps or in different magnitudes in respective sequences.

A sequenced switching device may comprise, for example, a switch and/or switch controller configured to mitigate variation of switch impedance during a switch transition from a start state to an end state by stepping the switch through a sequence of different states from the start state to at least one intermediate state to the end state. A method of mitigating variation in switch impedance during a switch transition from a start state to an end state may comprise, for example, stepping the switch through a sequence of different states from the start state to at least one intermediate state to the end state.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments of the disclosed subject matter and, together with the description, further serve to explain the principles involved and to enable a person skilled in the relevant art(s) to make and use the disclosed technologies. However, embodiments of the disclosed subject matter are not limited to the specific implementations disclosed herein. Each figure represents a different embodiment and components in each embodiment are intentionally numbered differently compared to potentially similar components in other embodiments.

DETAILED DESCRIPTION OF ILLUSTRATIVE EMBODIMENTS

Figure 1:
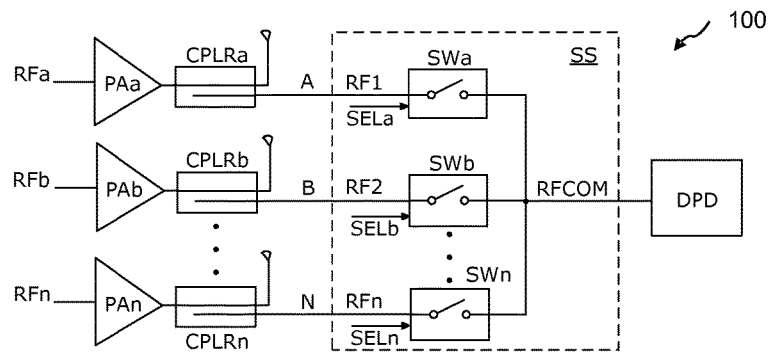
FIG. 1 illustrates an example of an RF power amplifier correction system having a sequenced switching device configured to mitigate variation of switch impedance during a switch transition by stepping the switch through a sequence of different states from a start state to at least one intermediate state to an end state.

Reference will now be made to embodiments of the disclosed subject matter, examples of which are illustrated in the accompanying drawings. While the technology will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting," "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality. Logic may be referred to as being enabled, disabled, high, low, on, off and the like.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components. The terms constant, substantially constant, maintain and substantially maintain are used interchangeably to have the same meaning of constant+/−10% variation. Maintenance of an impedance value permits some variation from the impedance value, but considerably less variation than impedance glitches during normal switching.

Sequenced switching mitigates impedance variations (e.g. glitches, spikes) and resulting signal reflections during switching events by stepping a switch incrementally through a sequence of different states from a start state to at least one intermediate state to an end state. Sequential reconfiguration of the structure and/or parameters of one or more switch branches may permit simplification of related programming and circuitry while increasing the lifespan of components spared from unmitigated current and voltage spikes. Each switch branch being transitioned in a switch event may have its own sequence dependent on switch or branch start and end states. For example, a branch being transitioned from ON to OFF and another branch being transitioned from OFF to ON may have one or more impedance elements switched ON or OFF at different steps or in different magnitudes in respective sequences.

A sequenced switching device may comprise, for example, a switch and/or switch controller configured to mitigate variation of switch impedance during a switch transition from a start state to an end state by stepping the switch through a sequence of different states from the start state to at least one intermediate state to the end state. A method of mitigating variation in switch impedance during a switch transition from a start state to an end state may comprise, for example, stepping the switch through a sequence of different states from the start state to at least one intermediate state to the end state.

Various states in a sequence may maintain, add, remove or change the value of impedance at one or more locations in a switch to mitigate impedance variations. Various architectures, sequencing and step control techniques may permit any degree of mitigation, including to the point of essentially eliminating impedance glitches. A sequenced switch may be configured to attempt to maintain constant impedance, for example, by dynamically managing switch impedance to eliminate or substantially reduce impedance glitches during switching events by stepping one or more variable impedances through sequences of impedance values. As a result, VSWR may be reduced to or near 1:1, allowing programming and circuitry to be simplified. Switch impedance may be maintained for single and multi-throw switches having variable impedances of any order. Each variable impedance may comprise one or more configurable transistor cells, subcells and elements controlled by thermometer, binary, hybrid or other coding technique. Variable impedance elements may be resistive, capacitive, inductive or any combination thereof. Impedance elements may comprise stacks of transistors designed to provide specific impedances. Switch impedance performance may be calibrated by adjusting sequence timing and/or thresholds.

Sequenced constant impedance switch parameters, such as cell, subcell, elements, step range, subrange, resolution, impedance sequence, number of steps, step values, step increments (e.g. step multiplier or log base), step timing, etc. may be determined by a constant impedance switch design program, e.g., by computer executable instructions, to maintain switch impedance during transitions.

Steps may be linear, logarithmic or other uniform or non-uniform increment to substantially maintain impedance during state transitions. Depending on each particular state transition, each variable impedance may be fixed or step through a sequence. Impedance configurations and sequence parameters may be the same or different for each variable impedance. For example, in a bidirectional switch where each port couples to a shunt impedance and each path (or arm) has a series impedance, sequences for one transition may be reversed for another transition, resulting in similar impedance cell configurations control. Switch impedance control may be implemented in digital and/or analog hardware, firmware and/or software. A sequence of control signals may be generated to step the at least one variable impedance through sequence(s) of impedance values for one or more switch events.

Each cell having one or more subcells or elements may provide an impedance range or subrange (if there are multiple cells) and each subcell having one or more elements may provide a subrange of impedance. Each impedance range, subrange and step may be uniform or nonuniform. Various cells and subcells may be fixed or variable with at least one cell being variable. Each variable cell or variable subcell comprises a plurality of stages, which may also be referred to as steps. Each unit cell (i.e. element) has a unit value or step value. The range or subrange of each variable cell or subcell is determined by the number of unit cells and their unit/step values therein. Stages or steps may be formed by physical combinations or single elements selected in the alternative with physical separation between distinct unit cells or stages. Regardless of the cellular architecture, the plurality of cells, subcells and elements serve to step one or more impedance parameters.

One or more cells may have a bypass to bypass or disable a cell. For example, a bypass may pass a signal through a cell without modification, although perhaps with some insertion loss. An advantage of variable cells is that a plurality of steps may share a single bypass, thereby reducing insertion loss by reducing the number of cells.

Variable cells have intra-cell and inter-cell architecture, coupling, coding, etc. within or between cells. Intra-cell stages or subcells, may be coupled in serial, parallel, a combination thereof or other configurations. Inter-cell coupling that externally couple cells may be serial, parallel, a combination thereof or other configurations.

Intra-cell and inter-cell coding may depend on the cell architecture. Intra-cell coding in variable cells may be the same or different amongst variable cells. Some variable cells may be thermometer-coded while others may be binary-coded while still others may have other coding. Inter-cell coding of cells in a step device may be the same or different compared to intra-cell coding of variable cells. A control code may be decoded, e.g., using a map or table, to translate a compact code to control selection of fixed and variable cells according to a desired state of the step device.

In some embodiments, direct control of cells may be implemented with control codes. In other embodiments, compact control codes and decoding may be used to generate inter-cell and intra-cell control codes. Direct or indirect control may be implemented in many ways. For example, logic may be incorporated into cells and/or into a step device external to cells, e.g., intra-cell logic and/or inter-cell logic. Decoding may be implemented in many ways, e.g., intra-cell logic and/or inter-cell logic implemented in analog or digital hardware or a combination of hardware and software, such as gates, multiplexer, translation table or map, etc. Each device state may be associated with a set of cell states and signals that would cause the enablement and disablement of different subcells or elements in the cells to generate the selected state for each cell. Each selectable cell, subcell, element and step within a cell may be implemented by any selectable technique. In some embodiments, elements in each cell or step within a cell may be implemented as one or more selectable transistor (e.g. FET) switches that enable and disable or couple and decouple components in a cell, whether the cell is a single or a multi-cell, in accordance with the desired cell state. The components, e.g., resistors, may be fixed or variable. In other embodiments, transistors may be impedance elements that switch themselves in and out of a circuit, designed to provide particular impedances when ON and OFF.

FIG. 1 illustrates an example of an RF power amplifier correction system having a sequenced switching device configured to mitigate variation of switch impedance during a switch transition by stepping the switch through a sequence of different states from a start state to at least one intermediate state to an end state. RF power amplifier correction system 100 is an example of many different systems that may be improved by mitigating impedance variation with sequenced switching. Other implementations using sequenced switching may have different components, architectures and purposes.

Power Amplifiers in base stations have stringent signal quality and emission requirements. A correction system, such as a digital pre-distortion (DPD) system, detects a portion of transmitted signals to look for error vectors to correct pre distortion on the baseband signal. A DPD system can service multiple power amplifiers. A multiple throw switch may be used in a DPD system to observe any number of RF signals. A switch may perform PA selection at RF signal levels greater than 1 Watt. A switch in a DPD system may be operated to connect a first power amplifier output while disconnecting a second power amplifier output, which traditionally causes substantial impedance glitches and signal reflections that may interrupt operation and degrade components.

In the example shown in FIG. 1, RF power amplifier correction system 100 utilizes sequenced switching to dynamically connect detected portions of RF signals to a DPD correction system. System 100 comprises RF power amplifiers (PA) a:n (e.g. PAa, PAb, PAn), RF couplers CPLR a:n, sequenced switch SS and digital pre-distortion system DPD.

RF power amplifiers (PA) a:n amplify, respectively, RF signals a:n (e.g. RFa, RFb, RFn). RF couplers CPLR a:n (e.g. CPLRa, CPLRb, CPLRn) sample a small portion of amplified RF signals a:n to generate RF samples a:n (e.g. RF signals A, B, N). RF samples a:n are provided to sequenced switch SS, which may be controlled to select none, one or more RF samples in any order to provide to digital pre-distortion system DPD. Digital pre-distortion system DPD receives and processes various RF samples a:n provided to it via sequenced switch SS common port RFCOM.

Sequenced switch SS illustrates a single pole multi-throw (SPxT) switch, although embodiments may be implemented in any switch having any number of poles and throws. Switch 100 and other switches in various implementations may be unidirectional or bidirectional. Switch 100 is shown as a radio frequency RF switch, although embodiments may be implemented in any technology utilizing switching.

Sequenced switch SS has n ports 1:n (e.g. RF1, RF2, RFn) and common RF port RFCOM. Sequenced switch SS has multiple branches SW a:n (e.g. SWa, SWb, SWn) between a particular port and RF common port RFCOM. Each branch SW a:n receives a respective RF sample RF a:n. Each branch SW a:n also receives a respective control signal SEL a:n (e.g. SELa, SELb, SELn). Switch control signals SEL a:n control sequenced switch SS, e.g., by controlling branches SW a:n. Switch control signals a:n may control states and transitions of sequenced switch SS overall and for each branch SW a:n.

Sequenced switch SS and/or one or more branches therein may be implemented using one or more switch elements. Sequenced switch SS and/or one or more branches therein may be implemented using one or more arms (e.g. series arms, shunt arms). Sequenced switch SS and/or one or more branches therein may be implemented using one or more fixed or variable impedance elements. A switch controller may be implemented in whole or in part within or without sequenced switch SS.

First switch control signal SELa may couple or connect common port RFCOM to first port RF1, thereby placing first branch SWa in a conducting, selected or ON state, enabling a first path to provide first RF sample A to common port RFCOM. First switch control signal SELa may also decouple or disconnect common port RFCOM from first port RF1, leaving the first branch SWa in an OFF state. Second switch control signal SELb may couple common port RFCOM to second port RF2, thereby placing second branch SWb in a conducting, selected or ON state, enabling a second path to provide second RF sample B to common port RFCOM. Second switch control signal SELb may also decouple or disconnect common port RFCOM from second port RF2, leaving the second branch SWb in an OFF state. Nth switch control signal SELn may couple common port RFCOM to nth port RFn, thereby placing nth branch SWn in a conducting, selected or ON state, enabling an nth path to provide nth RF sample N to common port RFCOM. Nth switch control signal SELn may also decouple or disconnect common port RFCOM from nth port RFn, leaving the nth branch SWn in an OFF state.

In the example shown in FIG. 1, there may be n+1 static states or conditions in sequenced switch SS, e.g., all OFF (all paths or branches off) or open state plus any one of n branches in an ON state while other deselected branches are in an OFF state. In an example, there may be $2n^2$ transitions (switch events) between start and end states (dynamic conditions), including all OFF to one of n branches ON and vice versa plus one branch ON to another one of n−1 branches ON and vice versa. Other sequenced switches may have different architectures, configurations, states and transitions.

Sequenced switch SS and/or one or more branches therein are implemented with one or more intermediate states between start and end states of one or more switch events to mitigate impedance variation during the one or more switch events. Sequenced switch SS provides power amplifiers PA a:n with reduced load reflection during switching, reduces the voltage and current swings on switch elements and enhances the reliability of both the amplifier and the switch.

A wide variety of sequenced switch architectures and design criteria present an infinite variety of embodiments. A change of state may comprise a reconfiguration of the switch or a change in a parameter, e.g., presence or magnitude of an impedance in a branch path. Time increments between steps in a transition sequence may be the same or different. The magnitude of change of a parameter between steps in a transition sequence may be the same or different. The types of parameters changed in various steps in a transition sequence may be the same or different.

Instead of large abrupt changes in impedance that cause substantial impedance glitches, state transitions may be accomplished by a sequence of states that change a parameter of or reconfigure sequenced switch SS, or any branch or path therein to mitigate impedance glitches. During a sequence of state transitions, switch element parameters (e.g. open, close) may change and/or impedance element parameters (e.g. impedance value) may change, which may reconfigure sequenced switch SS or one or more branches or paths therein. During switch events, one or more variable impedances in sequenced switch SS or in each path or branch of sequenced switch SS may be turned ON or OFF or may be shifted between high and low impedances depending on architecture and performance criteria for particular state transitions. A high impedance may provide the equivalent of an open circuit or OFF state while a low impedance may provide the equivalent of a short circuit or ON state for a path. One or more impedance values may be stepped, e.g., by opening or closing switches, to reduce impedance variation to any degree, including to substantially maintain impedance looking into one or more ports RF1, RF2, RFCOM at system characteristic impedance Zo. This may be accomplished with a certain number of intermediate steps in a sequence between start and end states, with or without increases in normal switch time, e.g., without intermediate steps and states. The number of steps, step sizes and other details may vary between applications and requirements. As but one of many examples, a one microsecond (μs) switch time may be preserved while reducing VSWR during switching from more than 9:1 down to 1.3:1.

Figures 2A, 2B:
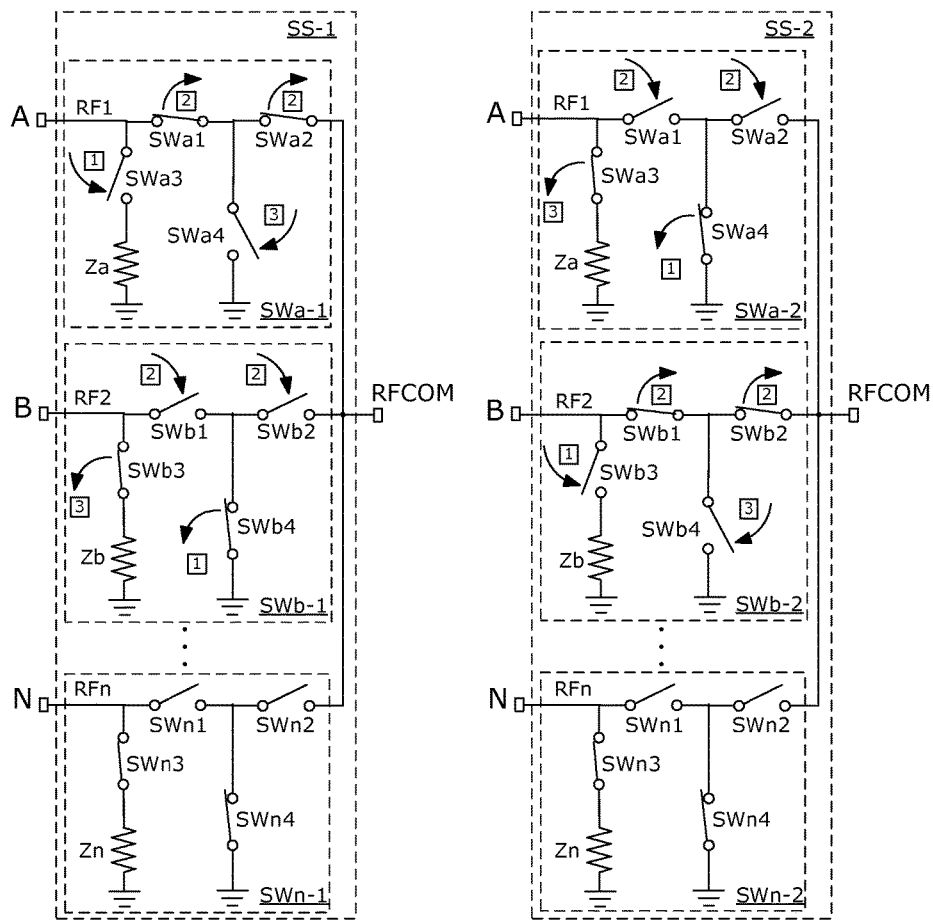
FIGS. 2A and 2B illustrate an example of sequenced multi-throw switch configured to mitigate variation of switch impedance during switch transitions by stepping multiple switch branches through respective sequences of different states from branch start states to one or more branch intermediate states to branch end states.

FIGS. 2A and 2B illustrate an example of a sequenced multi-throw switch configured to mitigate variation of switch impedance during switch transitions by stepping multiple switch branches through respective sequences of different states from branch start states to one or more branch intermediate states to branch end states.

FIGS. 2A and 2B illustrate an example architecture and configuration of multiple branches SW a:n (e.g. SWa, SWb, SWn) in sequenced switch SS. In the example branch architecture shown in FIG. 2A, sequenced switch SS, including first, second and nth branches SW1, SWb, SWn in FIG. 1 are shown in a first switch event sequence configuration SS-1, SWa-1, SWb-1, SWn-1. In the example branch architecture shown in FIG. 2B, sequenced switch SS, including first, second and nth branches SW1, SWb, SWn in FIG. 1 are shown in a second switch event sequence configuration SS-2, SWa-2, SWb-2, SWn-2.

Example branch architecture (e.g. branches SWa, SWb, SWn) shown in FIGS. 2A and 2B comprises a first series switch element SWx1 (e.g. SWa1, SWb1, SWn1), a second series switch element SWx2 (e.g. SWa2, SWb2, SWn2), a first shunt switch element SWx3 (e.g. SWa3, SWb3, SWn3) and a second shunt switch element SWx4 (e.g. SWa4, SWb4, SWn4). An impedance Zx (e.g. Za, Zb, Zn) is switched in and out of a branch by first shunt switch element SWx3. Impedance Zx may be fixed or variable and may vary between branches. A variable impedance Zx may be varied, for example, as shown in subsequent examples. Other implementations may comprise different architectures with different switch elements, impedance elements, overall architecture, etc.

First switch event sequence configuration SS-1, SWa-1, SWb-1, SWn-1 shows a start state, end state and two intermediate states for first switch event configuration SS-1 as well as a start state, end state and two intermediate states for first and second branches in first switch event configuration SWa-1 and SWb-1. During transitions of a sequenced switch, a branch may function as a sub sequence switch with its own sub sequence depending on the start state, end state and configured intermediate states for the branch. Architectures, configurations and the number and type of states and transitions for a switch and a branch may vary in other implementations.

In the first switch event configuration shown in FIG. 2A, first branch SWa-1 is configured to switch from ON to OFF and second branch SWb-1 is configured to switch from OFF to ON while other branches (e.g. nth branch SWn-1) remain OFF. These ON-OFF start-end states are accomplished in a sequence of state transitions. In this example, three branch transitions are labeled by numbers 1, 2 and 3 in boxes associated with arrows indicating whether a switch is opening or closing during the numbered state transition. The initial state of the switches indicates the start state configuration.

In the example shown in FIG. 2A, each branch is configured to have three state transitions in response to a switch event, i.e., a first transition from a start state to a first intermediate state, a second transition to a second intermediate state and a third transition to an end state. The start state of first branch SWa-1 is an ON state (coupling port A to port RFCOM) while the start state of second branch SWb-1 is OFF and the start state of nth branch SWn-1 is OFF.

First branch SWa-1 start state is configured with first series switch element SWa1 closed, second series switch element SWa2 closed, first shunt switch element SWa3 open and second shunt switch element SWa4 open. First branch SWa-1 first intermediate state (i.e. after the first transition indicated in FIG. 2A) is configured with first series switch element SWa1 closed, second series switch element SWa2 closed, first shunt switch element SWa3 closed and second shunt switch element SWa4 open. First branch SWa-1 second intermediate state (i.e. after the second transition indicated in FIG. 2A) is configured with first series switch element SWa1 open, second series switch element SWa2 open, first shunt switch element SWa3 closed and second shunt switch element SWa4 open. First branch SWa-1 end state (i.e. after the third transition indicated in FIG. 2A) is configured with first series switch element SWa1 open, second series switch element SWa2 open, first shunt switch element SWa3 closed and second shunt switch element SWa4 closed.

Second branch SWb-1 start state is configured with third series switch element SWb1 open, fourth series switch element SWb2 open, third shunt switch element SWb3 closed and fourth shunt switch element SWb4 closed. Second branch SWb-1 first intermediate state (i.e. after the first transition indicated in FIG. 2A) is configured with third series switch element SWb1 open, fourth series switch element SWb2 open, third shunt switch element SWb3 closed and fourth shunt switch element SWb4 open. Second branch SWb-1 second intermediate state (i.e. after the second transition indicated in FIG. 2A) is configured with third series switch element SWb1 closed, fourth series switch element SWb2 closed, third shunt switch element SWb3 closed and fourth shunt switch element SWb4 open. Second branch SWb-1 end state (i.e. after the third transition indicated in FIG. 2A) is configured with third series switch element SWb1 closed, fourth series switch element SWb2 closed, third shunt switch element SWb3 open and fourth shunt switch element SWb4 open.

In this example of a first switch event sequence, first and second series switches SWa1, SWa2 in first branch A open and second and third series switches SWb1, SWb2 in second branch B close during the second state transition to disconnect first port A from common port RFCOM and connect second port B to common port RFCOM. In the first transition, first impedance Za is switched into branch A, e.g., to provide a load to first port A before disconnecting first port A from common port RFCOM, and fourth shunt switch SWb4 is switched open to remove a short to ground. In the third transition, second impedance Zb is switched out of second branch B, e.g., to remove a load from second port B after connecting second port B to common port RFCOM, and second shunt switch SWa4 is switched closed to provide a short to ground.

Second switch event sequence configuration SS-2, SWa-2, SWb-2, SWn-2 shows a start state, end state and two intermediate states for second switch event configuration SS-2 as well as a start state, end state and two intermediate states for first and second branches in second switch event configuration SWa-2 and SWb-2. During transitions of a sequenced switch, a branch may function as a sub sequence switch with its own sub sequence depending on the start state, end state and configured intermediate states for the branch. Architectures, configurations and the number and type of states and transitions for a switch and a branch may vary in other implementations.

In the second switch event configuration shown in FIG. 2B, second branch SWb-1 is configured to switch from ON to OFF and first branch SWa-1 is configured to switch from OFF to ON while other branches (e.g. nth branch SWn-1) remain OFF. These ON-OFF start-end states are accomplished in a sequence of state transitions. In this example, three branch transitions are labeled by numbers 1, 2 and 3 in boxes associated with arrows indicating whether a switch is opening or closing during the numbered state transition. The initial state of the switches indicates the start state configuration.

In the example shown in FIG. 2B, each branch is configured to have three state transitions in response to a switch event, i.e., a first transition from a start state to a first intermediate state, a second transition to a second intermediate state and a third transition to an end state. The start state of second branch SWb-1 is an ON state (coupling port B to port RFCOM) while the start state of first branch SWa-1 is OFF and the start state of nth branch SWn-1 is OFF.

Second branch SWb-1 start state is configured with third series switch element SWb1 closed, fourth series switch element SWb2 closed, third shunt switch element SWb3 open and fourth shunt switch element SWb4 open. Second branch SWb-1 first intermediate state (i.e. after the first transition indicated in FIG. 2B) is configured with third series switch element SWb1 closed, fourth series switch element SWb2 closed, third shunt switch element SWb3 closed and fourth shunt switch element SWb4 open. Second branch SWb-1 second intermediate state (i.e. after the second transition indicated in FIG. 2B) is configured with third series switch element SWb1 open, fourth series switch element SWb2 open, third shunt switch element SWb3 closed and fourth shunt switch element SWb4 open. Second branch SWb-1 end state (i.e. after the third transition indicated in FIG. 2B) is configured with third series switch element SWb1 open, fourth series switch element SWb2 open, third shunt switch element SWb3 closed and fourth shunt switch element SWb4 closed.

First branch SWa-1 start state is configured with first series switch element SWa1 open, second series switch element SWa2 open, first shunt switch element SWa3 closed and second shunt switch element SWa4 closed. First branch SWa-1 first intermediate state (i.e. after the first transition indicated in FIG. 2B) is configured with first series switch element SWa1 open, second series switch element SWa2 open, first shunt switch element SWa3 closed and second shunt switch element SWa4 open. First branch SWa-1 second intermediate state (i.e. after the second transition indicated in FIG. 2B) is configured with first series switch element SWa1 closed, second series switch element SWa2 closed, first shunt switch element SWa3 closed and second shunt switch element SWa4 open. First branch SWa-1 end state (i.e. after the third transition indicated in FIG. 2B) is configured with first series switch element SWa1 closed, second series switch element SWa2 closed, first shunt switch element SWa3 open and second shunt switch element SWa4 open.

In this example of a second switch event sequence, first and second series switches SWa1, SWa2 in first branch A open and second and third series switches SWb1, SWb2 in second branch B close during the second state transition to disconnect second port B from common port RFCOM and connect second port A to common port RFCOM. In the first transition, second impedance Zb is switched into branch B, e.g., to provide a load to second port B before disconnecting second port B from common port RFCOM, and second shunt switch SWb4 is switched open to remove a short to ground. In the third transition, first impedance Za is switched out of first branch A, e.g., to remove a load from first port A after connecting first port A to common port RFCOM, and fourth shunt switch SWb4 is switched closed to provide a short to ground.

As indicated in subsequent figures, a switch and an impedance may be implemented as one or more transistors, e.g., a stack of transistors with associated control. The size of each transistor and the number or stack of transistors in a selectable cell or subcell configuration may be based on a variety of factors. For example, smaller transistor width generally results in higher impedance. Accomplishing a sequence of impedance steps may require different impedances in each cell or subcell. A smaller stack of transistors may reduce insertion loss, but also may decrease isolation and decrease power handling capability. A second order switch may provide better isolation than a first order switch.

Various configurations of cells, subcells, elements and sequence control coding to control switch and/or impedance sequencing during switching may permit one or more cells, subcells or elements to be turned on or off in each step/transition between states. Cells, subcells and elements (e.g. individual transistors or stacks) may be configured for and controlled by thermometer, binary, hybrid or other coding techniques to assemble and disassemble impedances in each step of a sequence. Cell, subcell and element configurations and coding techniques are discussed, for example, in U.S. patent application Ser. No. 13/539,409, filed Jun. 30, 2012, entitled "Multi-Bit Cell Attenuator," and U.S. patent application Ser. No. 13/539,406, filed Jun. 30, 2012, entitled "Hybrid-Coding for Improving Transient Switch Response in a Multi-Cell Programmable Apparatus," which are non-provisional, utility patent applications hereby incorporated by reference in their entireties as if fully set forth herein. Techniques discussed in these applications and other techniques may be applied to various embodiments of the technology described herein.

Figure 3:
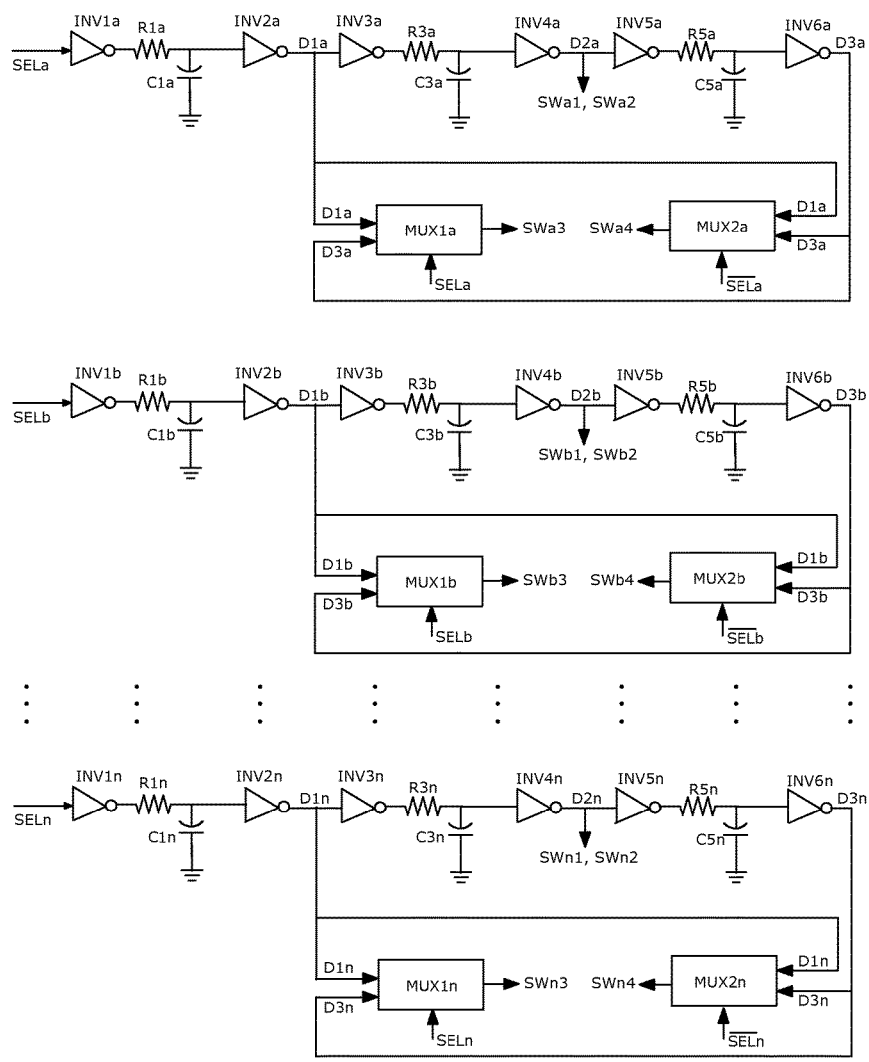
FIG. 3 illustrates an example of a switch controller configured to mitigate variation of switch impedance during switch transitions by stepping multiple switch branches through respective sequences of different states from branch start states to one or more branch intermediate states to branch end states.

FIG. 3 illustrates an example of a switch controller configured to mitigate variation of switch impedance during switch transitions by stepping multiple switch branches through respective sequences of different states from branch start states to one or more branch intermediate states to branch end states. Switch controller 300 presents one of many possible embodiments to control cells, subcells and elements to provide sequenced state transitions. Switch controller 300 may be used to control example sequenced switches in FIGS. 1, 2A and 2B, among other embodiments.

Switch controller 300 comprises n branch controllers controlling n branches in a sequenced switch, such as sequenced switch SS shown in FIG. 1. N branch control signals SEL 1:n (e.g. SELa, SELb, SELn) may be provided to switch controller 300. In another example, switch controller 300 may comprise a decoder (not shown), e.g., to generate first, second and nth branch control signals SEL 1:n (e.g. SELa, SELb, SELn) from a control code (not shown). A decoder may receive switch state or state transition information in a switch control signal, which may be provided, for example, by a switch controller or processor executing instructions. A decoder may decode a switch control signal into branch control signals SEL 1:n (e.g. SELa, SELb, SELn).

Branch control signals SEL 1:n (e.g. SELa, SELb, SELn) may be used to generate a sequence of transition signals that provide timing between steps in branch sequences. For example, a series of RC time constants may slew digital branch control signals and inverters may step skewed control signals to generate a sequence of switch element control signals. In other embodiments, other timing techniques may be used to provide timing between sequence steps.

As shown in the example in FIG. 3, switch controller 300 comprises n branch controllers, Each branch controller may generate state transition signals for a respective branch. For example, for the branch architecture and sequence configuration shown in FIGS. 2A and 2B, each of n branch controllers may generate switch element control signals, i.e., for first series switch element SWx1 (e.g. SWa1, SWb1, SWn1), second series switch element SWx2 (e.g. SWa2, SWb2, SWn2), first shunt switch element SWx3 (e.g. SWa3, SWb3, SWn3) and second shunt switch element SWx4 (e.g. SWa4, SWb4, SWn4). The number of switch element control signals may be based on the number of state transitions. In the present example, there are three transitions. As indicated in the examples in FIGS. 2A and 2B, three switch element control signals may be generated from a branch control signal, although application and order of application of three switch element control signals to switch elements depends on branch start and end states for a particular switch event.

A first branch controller comprises six inverters INV1a-6a, three resistors R1a, R3a, R5a, three capacitors C1a, C3a, C5a and two multiplexers MUX1a, MUX2a. First branch control signal SELa is inverted by first inverter INV1a, then slewed by a time constant provided by first timing resistor R1a and first timing capacitor C1a, then inverted by second inverter INV2a, which results in first switch element control signal D1a. First switch element control signal D1a is inverted by third inverter INV3a, then slewed by a time constant provided by third timing resistor R3a and third timing capacitor C3a, then inverted by fourth inverter INV4a, which results in second switch element control signal D1a. Second switch element control signal D2a is inverted by fifth inverter INV5a, then slewed by a time constant provided by fifth timing resistor R5a and fifth timing capacitor C5a, then inverted by sixth inverter INV6a, which results in third switch element control signal D3a.

First, second and third switch element control signals D1a, D2a, D3a are variously provided to control first series switch element SWa1, second series switch element SWa2, first shunt switch element SWa3 and second shunt switch element SWa4, which may depend, for example, on first branch SWa start and end states, whether there is a change in a control signal or the value of the control signal for a given switch event. The first branch controller may control first branch SWa for first and second configurations SS-1 and SS-2 shown in FIGS. 2A and 2B. As shown in FIG. 3, first and third switch element control signals D1a and D3a are provided to first and second multiplexers MUX1a and MUX2a to determine which will be provided to first and second shunt switch elements SWa3 and SWa4. First branch control signal SELa selects between first and third switch element control signals D1a and D3a for first shunt switch element SWa3. A complementary or inverted first branch control signal SELa (i.e. $\overline{\text{SELa}}$) selects between first and third switch element control signals D1a and D3a for second shunt switch element SWa4. Forward and reverse transitions of first branch SWa, e.g., from ON to OFF and from OFF to ON, shown in FIGS. 2A and 2B, illustrate forward and reverse ordering of switch element control for first and second shunt switches SWa3 and SWa4 in first branch SWa.

A second branch controller comprises six inverters INV1b-6b, three resistors Rib, R3b, R5b, three capacitors C1b, C3b, C5b and two multiplexers MUX1b, MUX2b. Second branch control signal SELb is inverted by first inverter INV1b, then slewed by a time constant provided by first timing resistor R1b and first timing capacitor C1b, then inverted by second inverter INV2b, which results in first switch element control signal D1b. First switch element control signal D1b is inverted by third inverter INV3b, then slewed by a time constant provided by third timing resistor R3b and third timing capacitor C3b, then inverted by fourth inverter INV4b, which results in second switch element control signal D1b. Second switch element control signal D2b is inverted by fifth inverter INV5b, then slewed by a time constant provided by fifth timing resistor R5b and fifth timing capacitor C5b, then inverted by sixth inverter INV6b, which results in third switch element control signal D3b.

First, second and third switch element control signals D1b, D2b, D3b are variously provided to control first series switch element SWb1, second series switch element SWb2, first shunt switch element SWb3 and second shunt switch element SWb4, which may depend, for example, on second branch SWb start and end states, whether there is a change in a control signal or the value of the control signal for a given switch event. The second branch controller may control second branch SWb for first and second configurations SS-1 and SS-2 shown in FIGS. 2A and 2B. As shown in FIG. 3, first and third switch element control signals D1b and D3b are provided to first and second multiplexers MUX1b and MUX2b to determine which will be provided to first and second shunt switch elements SWb3 and SWb4. Second branch control signal SELb selects between first and third switch element control signals D1b and D3b for first shunt switch element SWb3. A complementary or inverted first branch control signal SELb (i.e. $\overline{\text{SELb}}$) selects between first and third switch element control signals D1b and D3b for second shunt switch element SWb4. Reverse and forward transitions of second branch SWb, e.g., from OFF to ON and from ON to OFF, shown in FIGS. 2A and 2B, illustrate forward and reverse ordering of switch element control for first and second shunt switches SWb3 and SWb4 in second branch SWb.

An nth branch controller comprises six inverters INV1n-6n, three resistors R1n, R3n, R5n, three capacitors C1n, C3n, C5n and two multiplexers MUX1n, MUX2n. Nth branch control signal SELn is inverted by first inverter INV1n, then slewed by a time constant provided by first timing resistor R1n and first timing capacitor C1n, then inverted by second inverter INV2n, which results in first switch element control signal D1n. First switch element control signal D1n is inverted by third inverter INV3n, then slewed by a time constant provided by third timing resistor R3n and third timing capacitor C3n, then inverted by fourth inverter INV4n, which results in second switch element control signal D1n. Second switch element control signal D2n is inverted by fifth inverter INV5n, then slewed by a time constant provided by fifth timing resistor R5n and fifth timing capacitor C5n, then inverted by sixth inverter INV6n, which results in third switch element control signal D3n.

First, second and third switch element control signals D1n, D2n, D3n are variously provided to control first series switch element SWn1, second series switch element SWn2, first shunt switch element SWn3 and second shunt switch element SWn4, which may depend, for example, on nth branch SWn start and end states, whether there is a change in a control signal or the value of the control signal for a given switch event. The nth branch controller may control nth branch SWn as shown in FIGS. 2A and 2B. As shown in FIG. 3, first and third switch element control signals D1n and D3n are provided to first and second multiplexers MUX1n and MUX2b to determine which will be provided to first and second shunt switch elements SWn3 and SWn4. Nth branch control signal SELn selects between first and third switch element control signals D1n and D3n for first shunt switch element SWn3. A complementary or inverted nth branch control signal SELn (i.e. $\overline{\text{SELn}}$) selects between first and third switch element control signals D1$n$ and D3$n$ for second shunt switch element SWn4. Nth branch SWn is OFF in FIGS. 2A and 2B because Nth branch control signal SELn remains in a deselect state and first, second and third switch element control signals D1$n$, D2$n$, D3$n$ also do not change state.

The timing delay between each control signal in switch or branch sequences may be uniform or nonuniform. Switch controller 300 may be calibrated or corrected statically or dynamically, at least in part, by making timing resistors and/or timing capacitors variable so they can be tuned. One or both resistor and capacitor in one or more RC pairs may be tunable to adjust delays between sequence transitions, e.g. for correction or calibration in accordance with variations in process, temperature and voltage. In some implementations, the respective values of resistors and capacitors in each RC pair may be unit values, i.e., the same value. It is notable that use of terms start, beginning, end, last, and terms in-between, such as intermediate, refer to a unidirectional sequence. In some embodiments, including the present one, sequences may be bi-directional.

Figure 4:
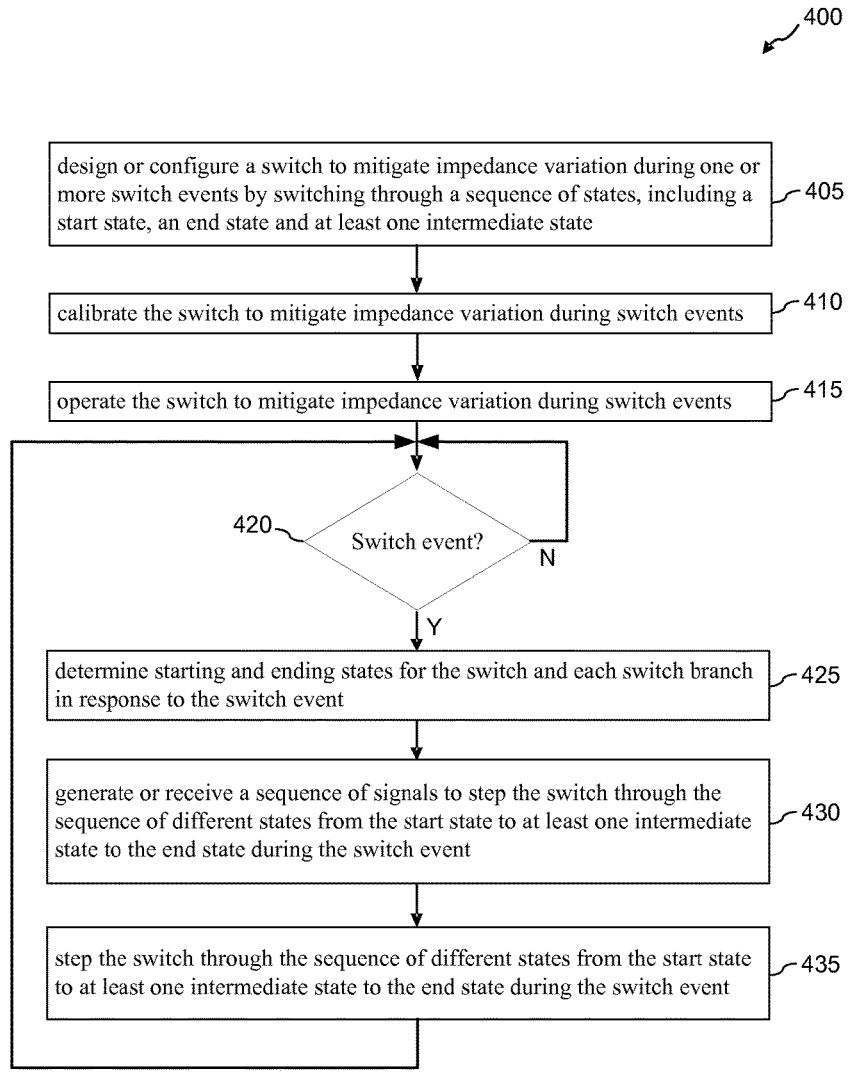
FIG. 4 illustrates an example of a method of mitigating variation in switch impedance during a switch transition by stepping the switch through a sequence of different states from a start state to at least one intermediate state to an end state.

Sequenced switching may be implemented as methods. An example of a method is illustrated in FIG. 4. FIG. 4 illustrates an example of a method of mitigating variation in switch impedance during a switch transition by stepping the switch through a sequence of different states from a start state to at least one intermediate state to an end state. No order of steps is required unless expressly indicated or inherently required. There is no requirement that an embodiment implement all of the steps illustrated in FIG. 4. FIG. 4 is simply one of many possible embodiments. Embodiments may implement fewer, more or different steps.

Method 400 comprises steps 405 to 440. In step 405, a switch is designed or configured to mitigate impedance variation during one or more switch events by switching through a sequence of states, including a start state, an end state and at least one intermediate state. For example, as shown and discussed with respect to example architecture and configuration shown in FIGS. 1-3, a designer or fabricator would select a sequenced switch architecture, a sequenced switch configuration, a branch architecture, a branch configuration and so on to meet performance criteria to sufficiently mitigate impedance variations during one or more switch events. Sequenced switch parameters, including a number of intermediate states, incremental step timing and element types and values or magnitudes in each step, etc. may be determined based on specifications indicating the number of poles, throws, number and type of switch events, power, operating frequency, isolation, insertion loss, types of impedance elements, etc.

In step 410, a sequenced switch is calibrated to mitigate impedance variation during one or more switch events. For example, as shown and discussed with respect to FIGS. 1-3, a manufacturer or end-user may calibrate a sequenced switch. One of many possible calibration techniques comprises calibrating the RC time constant that slews branch sequence control signals. Another calibration technique comprises calibrating variable impedances, e.g. first second and nth impedances Za, Zb, Zn. Calibration may be done manually or automatically by a manufacturer, an end user, a switch control circuit, software, etc.

In step 415, a sequenced switch is operated to mitigate impedance variation during one or more switch events. For example, as shown and discussed with respect to example architecture, configuration and control shown in FIGS. 1-3, step 415 may be implemented by operating sequenced switch SS in accordance with steps 425-435.

In step 420, a determination is made whether there is a switch event. For example, a control code and, consequently, branch control signals may indicate whether sequenced switch SS is transitioning between states. If there is a switch event, method 400 proceeds to step 425. If not, then sequenced switch SS maintains its current state and step 420 loops until there is an indication of a switch event.

In step 425, start and end states for a sequenced switch and each branch are determined in response to a switch event. For example, previous and current control codes or previous and current branch control signals may indicate start and end states for a sequenced switch and for particular branches therein.

In step 430, a sequence of signals to step the switch through the sequence of different states from the start state to at least one intermediate state to the end state during the switch event are generated or received. For example, as shown in FIG. 3, branch control signals (e.g. SELa, SELb, SELn) may be used to generate a sequence of state transition signals for each branch (e.g. D1$a$, D2$a$, D3$a$, D1$b$, D2$b$, D3$b$, D1$n$, D2$n$, D3$n$), which may be selected to control state transitions of various branch elements in various orders based on start and end states for each respective branch.

In step 435, a sequenced switch is stepped through the sequence of different states from the start state to at least one intermediate state to the end state during the switch event. For example, as shown in FIGS. 2A and 2B, branch control signals generated in FIG. 3 are used to step each branch that is transitioning through its respective start state to at least one intermediate state to an end state. At the end of step 435, method 400 returns to step 420 to await another switch event.

Figure 5:
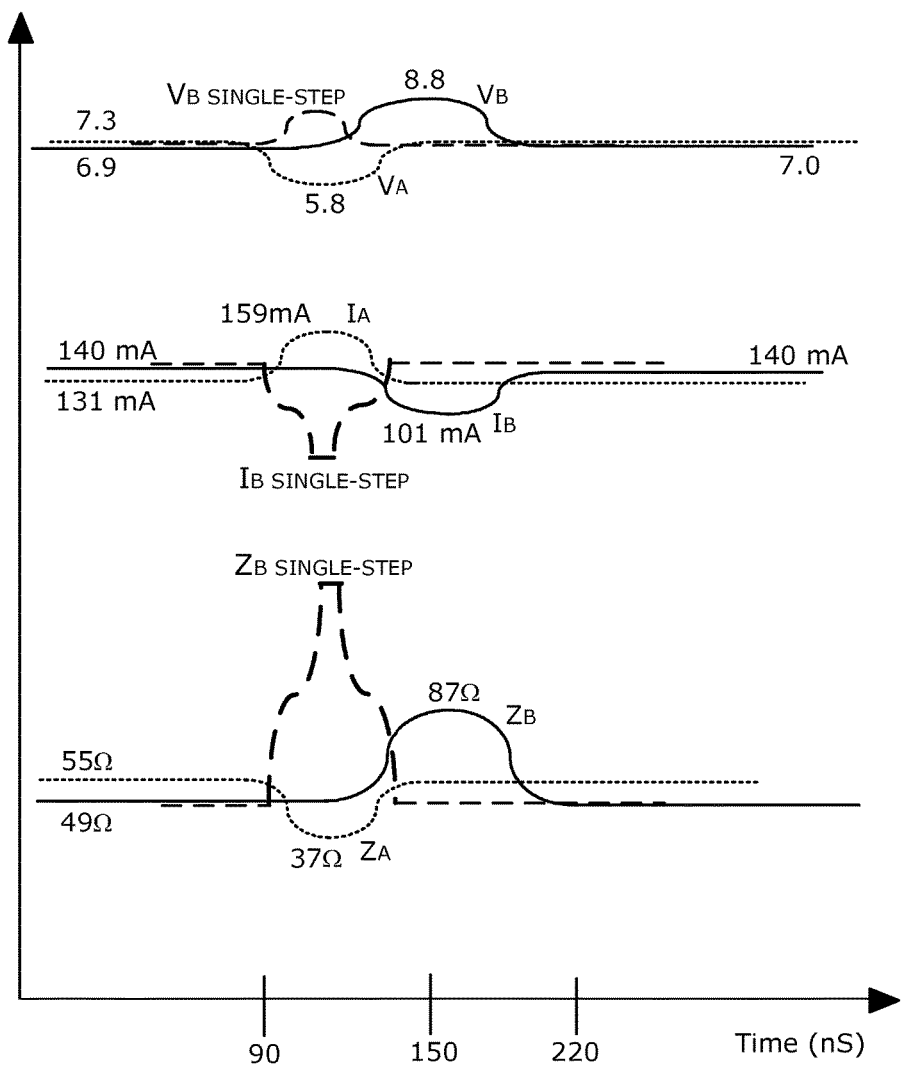
FIG. 5 illustrates an example comparison of variation in switch impedance in an example sequenced switch and a standard single-step switch.

FIG. 5 illustrates an example comparison of variation in switch impedance in an example sequenced switch and a standard single-step switch having similar parameters for the same switch event. The comparison is based on a sequenced switch having the configuration shown for first branch SWa and second branch SWb in FIG. 2A. The parameters for the single-step switch are the same as for the sequenced switch, but, unlike the sequenced switch, all switches switch at the same time in a single-step from start to end state. In other words, the sequenced switch has three transitions while the single-step switch has a single transition for a switch event.

FIG. 5 shows an envelope of an RF signal being hot-switched. Specifically, FIG. 5 shows the impedance, current and voltage seen at port B for an unsequenced single-step switch event and, for comparison, impedance, current and voltage seen at port A and port B for a sequenced switch architecture and configuration shown in FIG. 2B (where branch A is turned from OFF to ON and branch B is turned from ON to OFF) and for a branch controller configuration shown in FIG. 3. Port A impedance $Z_A$, current $I_A$ and voltage $V_A$ for a sequenced switch are indicated by dotted line. Port B impedance $Z_B$, current $I_B$ and voltage $V_B$ for the sequenced switch are indicated by solid line. Port B impedance $Z_{B\ SINGLE\text{-}STEP}$, current $I_{B\ SINGLE\text{-}STEP}$ and voltage $V_{B\ SINGLE\text{-}STEP}$ for a non-sequenced single-step switch are indicated by dashed line.

During single-step operation, a switch is exposed to a high VSWR during transitions before second branch impedance $Z_{B\ SINGLE\text{-}STEP}$ (e.g. 50 ohm resistor) is switched into second branch SWb to establish itself as the load for Port B, which is being deselected. The voltage at port B swings high and current drops when second branch SWb is turned off in a single-step. A high VSWR condition will subject switch elements and devices coupled to Port B to voltage swings that will breakdown or stress second branch SWb elements and devices coupled to Port B. In a lifetime of a switch, switch elements may be subjected to many large VSWR swings. Accordingly, costly compensation may be required during design and fabrication to permit a larger breakdown margin. This extra breakdown margin comes at the cost of larger devices, which increases chip area, increases material cost (e.g. by utilization of esoteric high-voltage technologies such as GaN), which may degrade performance in other ways (e.g. by increasing insertion loss).

In contrast to a single-step transition of second branch SWb shown as dashed lines, during sequenced transition of first and second branches SWa (OFF to ON) and SWb (ON to OFF), port A impedance decreases from 55 ohm to 37 ohm, creating a reflection coefficient magnitude of approximately 0.2, while port B impedance increases from 49 ohm to 87 ohms, creating a reflection coefficient of approximately 0.28. The corresponding VSWR for port A is approximately 1.5 and the corresponding VSWR for port B is 1.78.

It may be observed that the sequenced transition of first branch SWa completes in approximately the same time as unsequenced single-step transition of second branch SWb. The sequenced transition of second port SWb, which is being deselected, is shifted relative to single-step deselection of second branch SWb. The peak variation in impedance and current is substantially mitigated by sequenced switching.

FIGS. 1-5 illustrate some examples pertaining to sequenced switching to mitigate impedance variation during switch events by any degree. FIGS. 6-13 illustrate some examples pertaining to sequenced switching to mitigate impedance variation to the point of substantially or approximately eliminating (i.e. within 10%+/−) impedance variation, which may be referred to as maintaining constant impedance.

Figure 6:
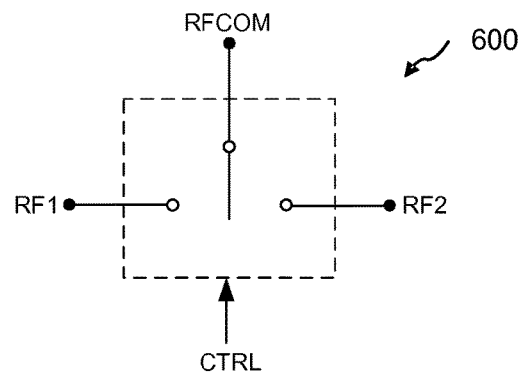
FIG. 6 illustrates an example of a sequenced switch with constant impedance sequence control.

FIG. 6 illustrates an example of a sequenced switch with constant impedance sequence control. Switch 600 represents a single pole double throw (SPDT or 1P2T) switch, although embodiments may be implemented in any switch having any number of poles and throws to maintain impedance during switching. Switch 600 and other constant impedance switches may be unidirectional or bidirectional. Switch 600 is shown as a radio frequency RF switch, although embodiments may be implemented in any technology. Switch 600 has three ports, first port RF1, second port RF2 and common or third port RFCOM. Common port RFCOM comprises the single pole while first and second ports RF1, RF2 comprise first and second throws.

Control CTRL specifies the states, and transitions, of switch 600. Switch 600 is shown in a center OFF or open position or state. Other embodiments may or may not have an all OFF state. Control CTRL may couple common port RFCOM to first port RF1, enabling a first path in a conducting or ON state. Control CTRL may couple common port RFCOM to second port RF2, enabling a second path in a conducting or ON state. Thus, in this embodiment there are three static states or conditions: the OFF (all paths off) or open state, a first path ON and second path OFF state and a second path ON first path OFF state. Six transitions between states (dynamic conditions) include open state to the first path state and vice versa, open state to the second path state and vice versa and the first path state to the second path state and vice versa.

Switch 600 may be implemented using a plurality of variable impedances. One or more variable impedances in each path of a switch may shift between high and low impedances depending on the state transition. A high impedance may provide the equivalent of an open circuit or OFF state while a low impedance may provide the equivalent of a short circuit or ON state for a path. Instead of abrupt changes in impedance that cause impedance glitches, state transitions are accomplished by concurrently stepping multiple variable impedances in concert to substantially maintain impedance looking into one or more ports RF1, RF2, RFCOM at system characteristic impedance Zo. This may be accomplished with a certain number of impedance steps while preserving normal switch time without the impedance steps. The number of steps, step sizes and other details may vary between applications and requirements. As but one of many examples, a one microsecond (µs) switch time can be preserved while reducing VSWR during switching from more than 9:1 down to 1.3:1.

Figure 7:
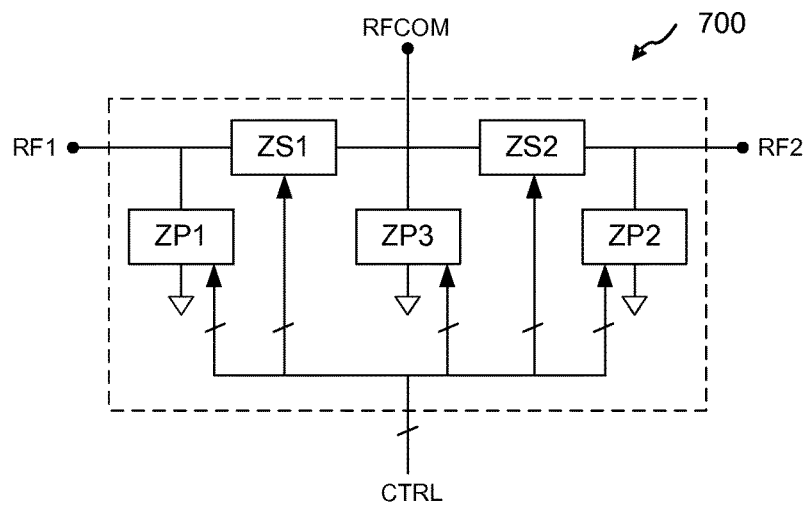
FIG. 7 illustrates a block diagram of an example of a sequenced, constant impedance single pole double throw first order switch with a plurality of variable impedances configured to provide constant impedance.

FIG. 7 illustrates a block diagram of an example of a sequenced, constant impedance single pole double throw first order switch with a plurality of variable impedances configured to provide constant impedance. Constant impedance switch 700 may be implemented in a variety of ways. In the embodiment shown, SPDT switch 700 comprises first variable series impedance ZS1 and first variable shunt impedance ZP1 coupled in a first path between first port RF1 and common port RFCOM. Switch 700 also comprises second variable series impedance ZS2 and second variable shunt impedance ZP2 coupled in a second path between second port RF2 and common port RFCOM. Finally, switch 700 comprises third variable shunt impedance ZP3 coupled to third or common port RFCOM. Third variable shunt impedance ZP3 may be viewed as being coupled in both the first and second paths. Each variable impedance ZS1, ZP1, ZS2, ZP2, ZP3 may comprise any impedance elements or components, whether resistive, capacitive, inductive or any combination thereof.

A controller (not shown) provides control signals CTRL to control first variable series impedance ZS1, first variable shunt impedance ZP1, second variable series impedance ZS2, second variable shunt impedance ZP2 and third variable shunt impedance ZP3. Control CTRL may step or hold variable impedances depending on which state transition is occurring. By controlling each variable impedance ZS1, ZP1, ZS2, ZP2, ZP3, control CTRL can place switch 1200 in each of its three static states by transitioning through any of the six dynamic conditions between the three static states while maintaining substantially constant impedance at first, second and third ports RF1, RF2, RFCOM. Each variable impedance ZS1, ZP1, ZS2, ZP2, ZP3 has static and dynamic (e.g. stepped) values to maintain constant impedance at first, second and third ports RF1, RF2, RFCOM.

Figure 8:
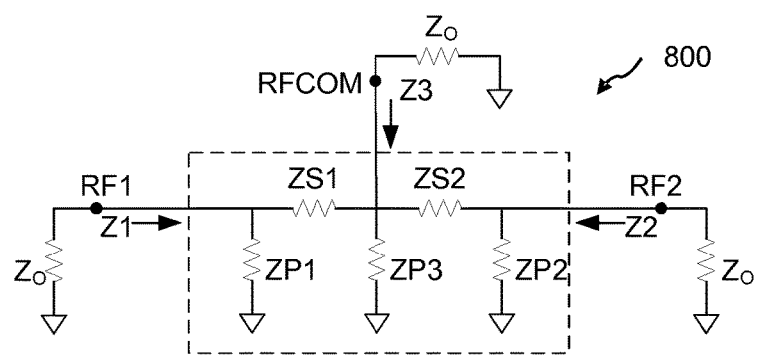
FIG. 8 illustrates an equivalent circuit of the example of a sequenced constant impedance switch in FIG. 7.

FIG. 8 illustrates an equivalent circuit of the example of a sequenced constant impedance switch in FIG. 7. As illustrated in FIG. 8, switch 800 is deployed in a system having characteristic impedance Zo. Note that characteristic impedance Zo may be the same or different at each port RF1, RF2, RFCOM, but for purposes of discussion is presumed to be the same. When the impedance looking into each port RF1, RF2, RFCOM is the same as system characteristic impedance Zo, then there will be no impedance glitches and VSWR at each port will be 1:1. The impedance of switch 800 looking into first port RF1 is given by first port impedance Z1. The impedance of switch 800 looking into second port RF2 is given by second port impedance Z2. The impedance of switch 800 looking into third port RF3 is given by third port impedance Z3. A design and operation objective is to control each variable impedance ZS1, ZP1, ZS2, ZP2, ZP3 to substantially maintain each port impedance Z1, Z2 and Z3 at system characteristic impedance Zo during both static states and dynamic conditions (transitions) between states.

Determining how to control each impedance ZS1, ZP1, ZS2, ZP2, ZP3 to maintain impedance at each port RF1, RF2 and RFCOM may involve an impedance analyses to solve for variables. When characteristic impedance Zo is the same for each port RF1, RF2 and RFCOM, the number of static states and dynamic conditions may be reduced due to symmetry. Static states may be reduced to two states: an open (OFF) state and a path (either path) ON state. Dynamic conditions may also be reduced to two conditions: switching between an OFF state and a path ON state and switching between path ON states (i.e. from first path ON, second path OFF state to first path OFF, second path ON state and vice versa).

In a first dynamic condition when switching between an OFF state and a path ON state, one or the other of the first and second paths will be OFF, which means one of first and second variable series impedances Zs1, Zs2 are deemed infinite (open circuit). For purposes of calculations, assume the first path is ON and the second path is OFF, which would mean for purposes of calculations that second variable series impedance Zs2 is an ideal high impedance. With second variable series impedance Zs2 open, second variable series impedance Zs2 and second variable shunt impedance Zp2 are irrelevant to the calculation of first and third port impedances Z1 and Z3. First port impedance Z1 is given by Equation 1:

$$Z_1 = Z_{p3} \| [(Z_o \| Z_{p1}) + Z_{s1}] \quad \text{Equation 1}$$

When second variable series impedance Zs2 is open, second port impedance Z2 equals second variable shunt impedance Zp2. In order for second port impedance Z2 to be equal to characteristic impedance Zo, second variable shunt impedance Zp2 must be equal to characteristic impedance Zo. Thus, second port impedance Z2 is given by Equation 2:

$$Z_2 = Z_2 = Z_o \quad \text{Equation 2}$$

Given the remaining circuit comprising first variable series impedance Zs1 and first and third variable shunt impedances Zp1, Zp3, symmetry in this circuit means first and third variable shunt impedances Zp1, Zp3 will be the same, as will first and third port impedances Z1 and Z3. Thus, third port impedance Z3 is given by Equation 3:

$$Z_3 = Z_1 \quad \text{Equation 3}$$

Characteristic impedance Zo is known since it is defined by the system that switch 800 is coupled to. Given that system characteristic impedance Zo is known, the only variables left are first variable series impedance Zs1 and first variable shunt impedance Zp1. These variables may be selected so that first port impedance Z1 equals characteristic impedance Zo. Assuming that step values for first variable series impedance Zs1 are selected, step values for first variable shunt impedance Zp1 may be determined by solving the equation for first variable shunt impedance Zp1, which is given by Equation 4:

$$Z_{p1} = \frac{2Z_o^2 \pm \sqrt{4Z_o^4 + 4Z_o^2 Z_{s1}}}{2Z_{s1}} \quad \text{Equation 4}$$

In one example, characteristic impedance Zo is 50Ω. The value of first variable series impedance Zs1 in a first path ON state (static state) may be dependent on an insertion loss requirement for an application of the switch. In this example, a static ON value of 1.25Ω may be selected as the static ON value of first variable series impedance Zs1. A static OFF value may also be selected for first variable series impedance Zs1 based on a requirement for an application of the switch. For example, a static OFF value of 10Ω may be selected as the static OFF value of first variable series impedance Zs1. A lower limit may also be selected for the shunt branch. For example, 50Ω may be the lower limit when the shunt branch is on. The number of steps or increments of variable impedances may also be selected. For example, one embodiment may have 10 steps η while other embodiments may have 5, 8, 15 or other number of steps. The type of transition across the step range may also be selected. For example, the type of transition may be linear, nonlinear, logarithmic, exponential, etc.

Table 1 below illustrates an example using a linear impedance step to maintain first, second and third port impedances Z1, Z2, Z3 at 50Ω during a transition from a first path ON state, second path OFF state to an all OFF state. In this embodiment, the uniform, linear step of first variable series impedance Zs1 is 499.875Ω Equation 4 provides the necessary value for first variable shunt impedance Zp1 based on the selected step value for first variable series impedance Zs1. It may be observed that this results in the vast majority of the impedance step for first variable shunt impedance Vp1 occurring in the first step (η=1) from 5Ω to 55.2Ω While a linear step may substantially eliminate impedance glitches in some embodiments, in this example there may be an impedance glitch. Other embodiments using a uniform, linear step may not result in such a large change in step magnitude (i.e. step size) based on design parameters and/or may permit a larger number of steps to reduce the step size (i.e. increase resolution). Other embodiments may use nonlinear (e.g. logarithmic or fixed multiple, variable multiple) steps or a mixture of linear and nonlinear steps (i.e. mixed or hybrid steps).

TABLE 1

Linear Impedance Step for Path 1 ON to all OFF

| η | $Z_{s1}$ | $Z_{p1}$ | $Z_1$ | $Z_2$ | $Z_3$ |
|---|---|---|---|---|---|
|  | 1.25 | 10000.00 | 50.25 | 50.00 | 50.25 |
| 1 | 501.13 | 55.20 | 50.00 | 50.00 | 50.00 |
| 2 | 11001.00 | 52.60 | 50.00 | 50.00 | 50.00 |
| 3 | 11000.88 | 51.70 | 50.00 | 50.00 | 50.00 |
| 4 | 12000.75 | 51.30 | 50.00 | 50.00 | 50.00 |
| 5 | 21000.63 | 51.00 | 50.00 | 50.00 | 50.00 |
| 6 | 13000.50 | 50.80 | 50.00 | 50.00 | 50.00 |
| 7 | 31000.38 | 50.70 | 50.00 | 50.00 | 50.00 |
| 8 | 9000.25 | 50.60 | 50.00 | 50.00 | 50.00 |
| 9 | 41000.13 | 50.60 | 50.00 | 50.00 | 50.00 |
| 10 | 10000.00 | 50.50 | 50.00 | 50.00 | 50.00 |

Table 2 below illustrates an example using a logarithmic impedance step to maintain first, second and third port impedances Z1, Z2, Z3 at 50Ω during a transition from a first path ON state, second path OFF state to an all OFF state. The logarithmic base selected in this embodiment is 2.2. A number of factors may be evaluated to determine the most appropriate base, including the characteristic impedance, impedance range, power handling requirements, operating frequency range, etc. For example, in an RF implementation, the first step of 3187.20Ω from 5Ω to 1813.80Ω for first variable shunt impedance Zp1 is an acceptable step in view of 50Ω characteristic impedance. Each step η is the exponent the base is raised to, which increases the multiple applied to static first variable series impedance Zs1 in each step η. Equation 4 provides the necessary value for first variable shunt impedance Zp1 based on the selected step value for first variable series impedance Zs1. It may be observed that the logarithmic steps result in a more gradual sweep in impedance values for first variable series impedance Zs1 and first variable shunt impedance Vp1. This avoids substantial impedance spikes, resulting in a VSWR of nearly 1:1 during switching transitions. It may also be observed from Table 2 that, at least in some embodiments, fewer steps may be used, VSWR design specifications permitting. Other embodiments may require higher resolution, which may require additional steps depending on the linearity of steps permitted to remain within design specifications.

TABLE 2

Logarithmic Impedance Step for Path 1 ON to all OFF

| η | Multiple | $Z_{s1}$ | $Z_{p1}$ & $Z_{p3}$ | $Z_1$ | $Z_2$ | $Z_3$ |
|---|---|---|---|---|---|---|
|   |         | 1.25     | 10000.00 | 50.25 | 50.00 | 50.25 |
| 1 | 2.20    | 2.76     | 1813.80  | 50.00 | 50.00 | 50.00 |
| 2 | 4.84    | 6.07     | 826.80   | 50.00 | 50.00 | 50.00 |
| 3 | 10.65   | 13.35    | 381.00   | 50.00 | 50.00 | 50.00 |
| 4 | 23.43   | 29.38    | 183.80   | 50.00 | 50.00 | 50.00 |
| 5 | 51.54   | 64.63    | 101.90   | 50.00 | 50.00 | 50.00 |
| 6 | 113.38  | 142.18   | 70.60    | 50.00 | 50.00 | 50.00 |
| 7 | 249.44  | 312.79   | 58.60    | 50.00 | 50.00 | 50.00 |
| 8 | 548.76  | 688.14   | 53.80    | 50.00 | 50.00 | 50.00 |
| 9 | 1207.27 | 11013.92 | 51.70    | 50.00 | 50.00 | 50.00 |
| 10| 2655.99 | 10000.00 | 50.50    | 50.00 | 50.00 | 50.00 |

The results found in the first dynamic condition may be used to solve equations in other dynamic conditions. In the second dynamic condition when switching between path ON states (i.e. from first path ON, second path OFF state to first path OFF, second path ON state and vice versa), third variable shunt impedance Zp3 is infinite (open circuit). This leaves four variables to control: first and second series impedances Zs1, Zs2 and first and second variable shunt impedances Zp1, Zp2. First port impedance Z1 is given by Equation 5, second port impedance Z2 is given by Equation 6 and third port impedance Z3 is given by Equation 7:

$$Z_1 = \{[(Zo\|Zp2)+Zs2]\|Zo+Zs1\}\|Zp1 \quad \text{Equation 5}$$

$$Z_2 = \{[(Zo\|Zp1)+Zs1]\|Zo+Zs2\}\|Zp2 \quad \text{Equation 6}$$

$$Z_3 = [(Z_o\|Z_{p1})+Z_{s1}]\|[(Z_o\|Z_{p2})+Z_{s2}] \quad \text{Equation 7}$$

Equations 5-7 can be solved for any variable. In Equations 5-7, characteristic impedance Zo is known (e.g. 50Ω) since it is defined by the system switch 800 is coupled to. In some embodiments, it may be desirable to ensure that the solutions for each transition utilize the same set of step values (albeit in different orders as needed to maintain port impedances) to minimize design, fabrication and operating costs. Other embodiments may employ different sets of step values for different transitions. However, for purposes of this embodiment, it will be presumed that the same set of step values will be used for all transitions (in different orders as needed to maintain port impedances). Thus, the information (step sequences) in Table 2 for first variable series impedance Zs1 and first variable shunt impedance Zp1 could be used and, due to symmetry, could be reversed for second variable series impedance Zs2 and second variable shunt impedance Zp2.

Table 3 below shows a slightly different logarithmic step example than shown in Table 2 to maintain first, second and third port impedances Z1, Z2, Z3 at 50Ω during a transition from a first path ON state, second path OFF state to second path ON state, first path OFF state. In the embodiment shown in Table 3, the log base is 2.16 and the static ON impedance is 1.4Ω for first variable series impedance Zs1. The static OFF value remains 10Ω. Characteristic impedance Zo remains at 50Ω. The number of steps η remains at 10. The sets of step values (step sequences) in Table 3 for first variable series impedance Zs1 and first variable shunt impedance Zp1 were verified for the first path ON to all OFF state transition. The step sequences can be reused in the first path ON to second path ON state transition. Due to symmetry, the step sequences for first variable series impedance Zs1 and first variable shunt impedance Zp1 are reversed for second variable series impedance Zs2 and second variable shunt impedance Zp2.

TABLE 3

Logarithmic Impedance Step for Path 1 ON to Path 2 ON

| η | Multiple | $Z_{s1}$ | $Z_{p1}$ | $Z_{s2}$ | $Z_{p2}$ | $Z_1$ | $Z_2$ | $Z_3$ |
|---|---|---|---|---|---|---|---|---|
|   |         | 1.4     | 10000.0 | 10000.0 | 50.5    | 50.00 | 50.00 | 50.00 |
| 1 | 2.16    | 3.1     | 1609.1  | 1473.8  | 51.7    | 50.00 | 50.00 | 50.00 |
| 2 | 4.67    | 6.7     | 747.6   | 682.3   | 53.8    | 50.00 | 50.00 | 50.00 |
| 3 | 10.08   | 14.5    | 351.7   | 315.9   | 58.5    | 50.00 | 50.00 | 50.00 |
| 4 | 21.77   | 31.3    | 173.9   | 146.2   | 69.9    | 50.00 | 50.00 | 50.00 |
| 5 | 47.02   | 67.7    | 99.1    | 67.7    | 99.1    | 50.00 | 50.00 | 50.00 |
| 6 | 101.56  | 146.2   | 69.9    | 31.3    | 173.9   | 50.00 | 50.00 | 50.00 |
| 7 | 219.37  | 315.9   | 58.5    | 14.5    | 351.7   | 50.00 | 50.00 | 50.00 |
| 8 | 473.83  | 682.3   | 53.8    | 6.7     | 747.6   | 50.00 | 50.00 | 50.00 |
| 9 | 1023.49 | 1473.8  | 51.7    | 3.1     | 1609.1  | 50.00 | 50.00 | 50.00 |
| 10| 2210.74 | 10000.0 | 50.5    | 1.4     | 10000.0 | 50.00 | 50.00 | 50.00 |

The foregoing equations for this embodiment and equations for other embodiments of a constant impedance switch can be solved by a switch design calculator, which may be implemented as software instructions stored on a computer-readable storage medium and executed by a computer processor. Such a calculator can simultaneously, including iteratively, solve (e.g. try to find an optimal value) for each variable impedance based on a selected design parameters provided to the calculator, such as one or more of impedance step range, resolution, switch time, impedance type or implementation, number of steps, characteristic impedance, log base, insertion loss, isolation. The calculator can solve for one, several or all state transitions for a particular switch.

There are numerous advantages to substantially maintaining first, second and port impedances Z1, Z2, Z3 at characteristic impedance Zo during each of its transitions. By maintaining switch impedance during transitions, VSWR remains at or near 1:1, impedance spikes and reflections are eliminated, switching time may be reduced, operations can continue without delay and there is no need to design, fabricate and operate complex circuitry and programming to contend with impedance spikes and reflections.

Figure 9:
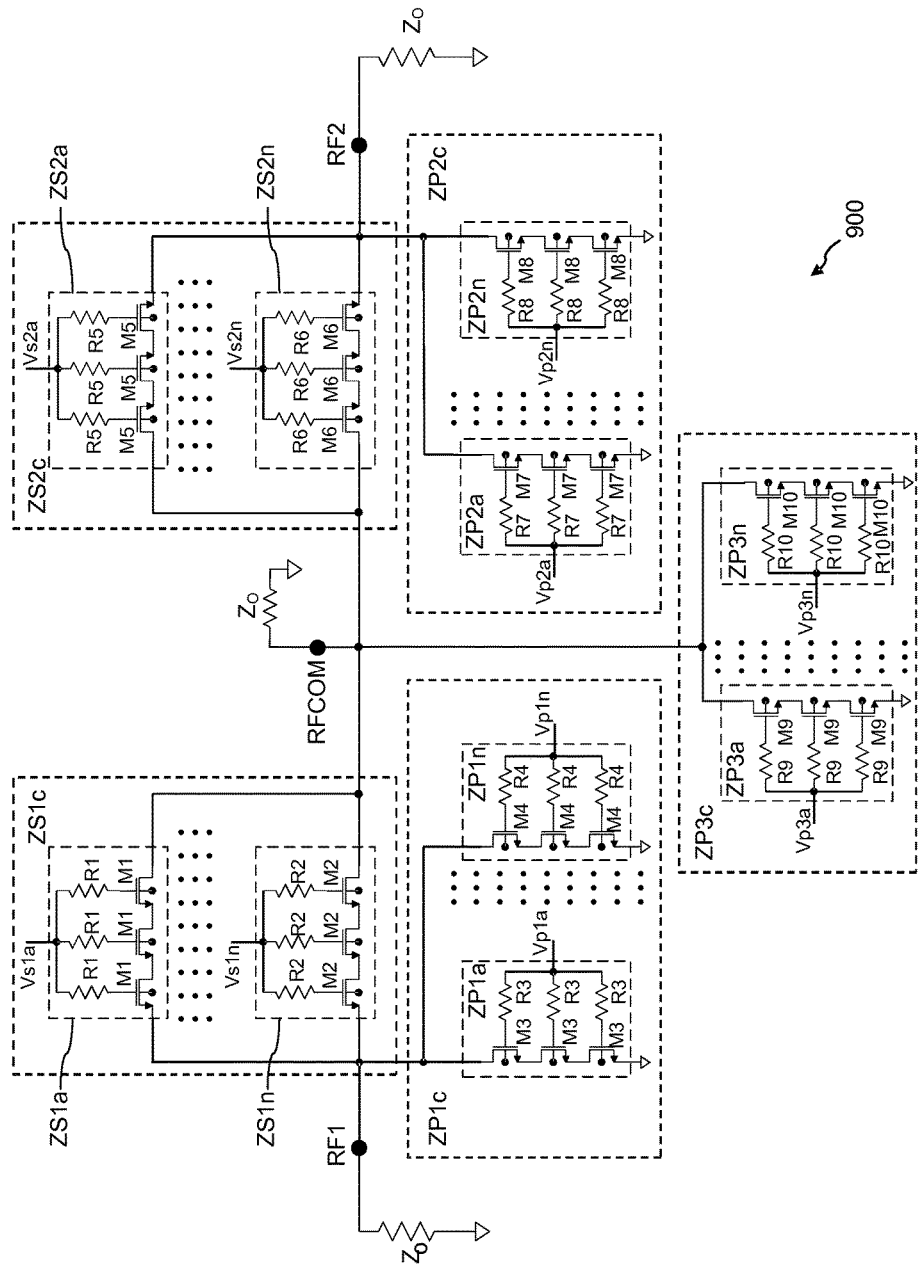
FIG. 9 illustrates an example implementation of a variable impedance as a configurable transistor cell.

FIG. 9 illustrates an example implementation of a variable impedance as a configurable transistor cell. Constant impedance switch 900 comprises first variable series impedance cell ZS1c, first variable shunt impedance cell ZP1c, second variable series impedance cell ZS2c, second variable shunt impedance cell ZP2c and third variable shunt impedance cell ZP3c. Each variable impedance in this embodiment is shown as one cell with selectable subcells having sets of selectable elements, such that each cell, subcell and its elements are used in each transition. In other embodiments, each variable impedance may comprise any number of cells, subcells and elements. In some embodiments, different cells, different sets of subcells within cells and/or different sets of transistors in subcells or cells may be selectable for different transitions or operating conditions (power, voltage, etc.). For example, a multiplexer may be deployed to select among cells and/or subcells.

Impedance cell architecture may vary widely between embodiments. In some embodiments, each variable impedance may comprise one or more cells, each cell may comprise a plurality of subcells and each subcell may comprise elements. Cells, subcells and elements may be used in the alternative or in combination. A cell may also comprise elements with or without subcells. Selectable elements may comprise any type(s) of impedance. Examples of elements include, without limitation, resistors, inductors, capacitors, pin diodes and transistors. In this embodiment, the elements are transistors. Depending on the architecture, elements may be individually selectable or selectable by selecting subcells or cells. However configured, elements are selected or configured, in any order and combination, to provide the impedance values in impedance sequences, such as the impedance sequences shown in Table 3. Each selected configuration of cells, subcells and elements provides an impedance that can be utilized to provide all or part of one or more step values in an impedance sequence. Cells, subcells and elements may be configured for combination using any arithmetic operation(s), e.g., addition, subtraction, multiplication, division. For example, it may be observed that subcells shown in FIG. 9 are in parallel. In other embodiments, subcells may be arranged in serial and/or parallel. In some embodiments only one subcell is selected (ON) for each step in a sequence. In other embodiments, a subcell is added or subtracted in each sequence, such that all subcells would be on in the first step or the last step of a sequence. In other embodiments, subcells are selected individually or grouped to provide certain impedance values in a sequence without selecting all at once.

In this embodiment, first variable series impedance cell ZS1c comprises a plurality of subcells ZS1a ... ZS1n. First variable shunt impedance cell ZP1c comprises a plurality of subcells ZP1a ... ZP1n. Second variable series impedance cell ZS2c comprises a plurality of subcells ZS2a ... ZS2n. Second variable shunt impedance cell ZP2c comprises a plurality of subcells ZP2a ... ZP2n. Third variable shunt impedance cell ZP3c comprises a plurality of subcells ZP3a ... ZP3n. The letter "a" represents a first subcell and the letter "n" represents any number. There may be any number of subcells between a and n subcells. The subcells are selected, in any order and combination, to configure the impedance values in an impedance sequence, such as the impedance sequences shown in Table 3.

Each subcell may comprise one or more selectable impedance elements. In this embodiment, selectable impedance elements comprise transistors and, specifically, MOSFETs. In this embodiment, each subcell comprises a set or stack of three selectable transistors. However, in other embodiments there may be any number of elements (e.g. transistors). The number of transistors in respective cells or respective subcells may be the same or different. In some embodiments, power handling, isolation, insertion loss and/or other design parameters may necessitate multiple transistors.

Subcell ZS1a comprises first transistors M1. Subcell ZS1n comprises second transistors M2. Subcell ZP1a comprises third transistors M3. Subcell ZP1n comprises fourth transistors M4. Subcell ZS2a comprises fifth transistors M5. Subcell ZS2n comprises sixth transistors M6. Subcell ZP2a comprises seventh transistors M7. Subcell ZP2n comprises eight transistors M8. Subcell ZP3a comprises ninth transistors M9. Subcell ZP3n comprises tenth transistors M10.

First resistors R1 coupled to the gates of first transistors M1 together establish a first RC time constant defining switching speed for subcell ZS1a in response to control signal Vs1a. Second resistors R2 coupled to the gates of second transistors M2 together establish a second RC time constant defining switching speed for subcell ZS1n in response to control signal Vs1n. Third resistors R3 coupled to the gates of third transistors M3 together establish a third RC time constant defining switching speed for subcell ZP1a in response to control signal Vp1a. Fourth resistors R4 coupled to the gates of fourth transistors M4 together establish a fourth RC time constant defining switching speed for subcell ZP1n in response to control signal Vp1n. Fifth resistors R5 coupled to the gates of fifth transistors M5 together establish a fifth RC time constant defining switching speed for subcell ZS2a in response to control signal Vs2a. Sixth resistors R6 coupled to the gates of sixth transistors M6 together establish a sixth RC time constant defining switching speed for subcell ZS2n in response to control signal Vs2n. Seventh resistors R7 coupled to the gates of seventh transistors M7 together establish a seventh RC time constant defining switching speed for subcell ZP2a in response to control signal Vp2a. Eighth resistors R8 coupled to the gates of eighth transistors M8 together establish an eighth RC time constant defining switching speed for subcell ZP2n in response to control signal Vp2n. Ninth resistors R9 coupled to the gates of ninth transistors M9 together establish a ninth RC time constant defining switching speed for subcell ZP3a in response to control signal Vp3a. Tenth resistors R10 coupled to the gates of tenth transistors M10 together establish a tenth RC time constant defining switching speed for subcell ZP3n in response to control signal Vp3n. Of course there may be additional subcells between cells a and n, each comprising additional impedance elements (e.g. transistors) configured to provide specific impedances. Also note that transistor bias is not shown, but may be necessary in some embodiments.

Although constant impedance switch 900 is shown as non-absorptive, constant impedance switches in other embodiments may be absorptive. In an absorptive switch, each shunt impedance subcell is coupled to ground through an impedance (e.g. resistor), which reduces the impedance that shunt cells must provide.

Table 4 provides an exemplary implementation of part of the switch shown in FIG. 9 with respect to the sequences provided in Table 2 to transition from the Path 1 ON, path 2 OFF state to the all paths OFF state. The parameters in Table 4 are based on a transistor stack height in each subcell of three, a characteristic impedance of 45 Ohms, a corner frequency $f_o$ of 16 MHz and unit Oxide capacitance equal to 1.84 pF/mm. Of course, other embodiments may have the same or different parameters. The switching speed is given by an RC time constant in Equation 8, where capacitance C is the gate capacitance of a particular transistor, e.g., M1, and R is the gate resistor, e.g. R1:

$$RC = \frac{1}{2\pi f_o} \qquad \text{Equation 8}$$

TABLE 4

Subcell Design for Logarithmic Impedance Step for Path 1 ON to all OFF

| η | Sequence of turning off resistor transistors with widths (mm) in cells Zs1a-n | Series cell gate resistor values (Ω) in cells Zs1a-n | Sequence of turning on transistors with widths (mm) in cells Zp1a-n & Zp3a-n | Shunt cell gate resistor values (Ω) in cells Zp1a-n & Zp3a-n |
|---|---|---|---|---|
|  | 0.130556 (All ON) | 6,711 | All OFF |  |
| 1 | 0.37294 | 14,496 | 0.00138 | 3,914,561 |
| 2 | 0.17266 | 31,311 | 0.00169 | 3,192,357 |
| 3 | 0.07993 | 67,631 | 0.00397 | 1,361,974 |
| 4 | 0.03701 | 146,084 | 0.00971 | 556,474 |
| 5 | 0.01713 | 315,541 | 0.02318 | 233,201 |
| 6 | 0.00793 | 681,568 | 0.04668 | 115,808 |
| 7 | 0.00367 | 1,472,187 | 0.07295 | 74,111 |
| 8 | 0.00170 | 3,179,925 | 0.08594 | 62,903 |
| 9 | 0.00147 | 3,688,713 | 0.07568 (All ON) | 71,436 |
| 10 | All OFF |  | 0.07136 | 75,757 |

The size of each transistor and the number or stack of transistors in each cell or subcell may be based on a variety of factors. For example, smaller transistor width generally results in higher impedance. Accomplishing the sequence of impedance steps may require different impedances in each cell or subcell. A smaller stack of transistors may reduce insertion loss, but also may decrease isolation and decrease power handling capability. A second order switch may provide better isolation than a first order switch.

While the configuration of FIG. 9 and sequences in Table 4 permit sequence control such that one subcell or element is turned on or off in each step, resulting in all subcells or elements being on or off at the end of a sequence, other embodiments may employ the same or different configurations of cells, subcells, elements and coding to control impedance sequencing during switching. In other embodiments, cells, subcells and elements may be configured for and controlled by thermometer, binary, hybrid or other coding techniques to assemble and disassemble impedances in each step of a sequence. Cell, subcell and element configurations and coding techniques are discussed, for example, in U.S. patent application Ser. No. 13/539,409, filed Jun. 30, 2012, entitled "Multi-Bit Cell Attenuator," and U.S. patent application Ser. No. 13/539,406, filed Jun. 30, 2012, entitled "Hybrid-Coding for Improving Transient Switch Response in a Multi-Cell Programmable Apparatus," which are non-provisional, utility patent applications hereby incorporated by reference in their entireties as if fully set forth herein. Techniques discussed in these applications and other techniques may be applied to various embodiments of the technology described herein.

Figure 10:
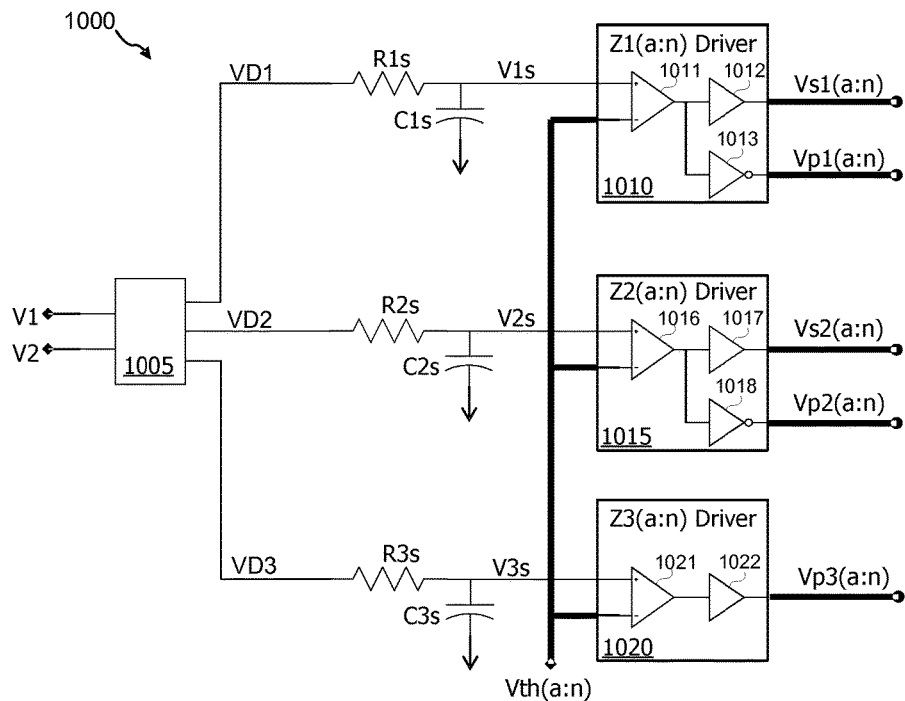
FIG. 10 illustrates an example of a control circuit to control a sequenced constant impedance switch.

FIG. 10 illustrates an example of a control circuit to control a sequenced constant impedance switch. Control circuit 1000 presents one of many possible embodiments to control cells, subcells and elements to provide impedance sequences for state transitions. Control circuit 1000 may be used to control the exemplary constant impedance switch in FIG. 7, among other embodiments with appropriate scaling.

Control circuit 1000 comprises decoder 1005, Z1(a:n) driver 1010, Z2(a:n) driver 1015 and Z3(a:n) driver 1020. Decoder 1005 receives state or state transition information in switch control signals V1 and V2, which may be provided, for example, by a switch controller or processor executing instructions. Decoder 1005 decodes switch control signals V1, V2 into first, second and third impedance control signals VD1, VD2 and VD3. First impedance control signal VD1 is provided to Z1 driver 1010, second impedance control signal VD2 is provided to Z2 driver 1015 and third impedance control signal VD3 is provided to Z3 driver 1020. First, second and third impedance control signals VD1, VD2 and VD3 may step discretely, e.g. zero to three volts.

In one embodiment, first, second and third impedance control signals VD1, VD2 and VD3 may be used to provide timing between steps in impedance sequences by using RC time constants to slew these control signals. The slewed control signals are compared to thresholds to provide timing for each step in the sequence. For example, if first, second and third impedance control signals are 0 Volt low and 3 Volt high then thresholds may be generated by linearly or non-linearly dividing 3 Volts by the number of steps in a transition sequence to generate respective thresholds Vth(a:n). As the slewed signals V1s, V2s and V3s cross each respective threshold Vth(a:n) a subcell is activated or deactivated. In other embodiments, independent timing circuitry and other timing techniques may be used to provide timing between sequence steps.

When RC circuits are used to slew impedance control signals, there may be an exponential rise from 0V to Vdd voltage range and an exponential fall from Vdd to 0V. Threshold voltages could be set by unit resistors or different resistors in a resistive ladder. Resistors and threshold levels (i.e. comparator trigger points) may be selected to provide uniform or non-uniform timing between sequence steps. To optimize uniform step timing, thresholds can be adjusted by using different value resistors in the ladder. An array of resistors can be printed into a substrate. In some embodiments, when unit resistors are used, resulting in non-uniform timing between sequence steps, impedance magnitudes in steps may be adjusted for the non-uniform timing to fit a desired impedance transition curve.

In the embodiment shown in FIG. 10, first impedance control signal VD1 is slewed by a time constant provided by first timing resistor R1S and first timing capacitor C1, which results in slewed first impedance control signal V1s. Second impedance control signal VD2 is slewed by a time constant provided by second timing resistor R2S and second timing capacitor C2, which results in slewed second impedance control signal V2s. Third impedance control signal VD3 is slewed by a time constant provided by third timing resistor R3S and third timing capacitor C3, which results in slewed third impedance control signal V3s. Control circuit 1000 may be calibrated, at least in part, by making first, second and third timing resistors R1S, R2S, R3S and/or first, second and third timing capacitors C1, C2, C3 variable so they can be tuned. Control circuit may also be calibrated, at least in part, if thresholds Vth(a:n) are variable so they can be tuned. The time constants created in the control circuit should be faster than RC time constants formed in the subcells.

Z1(a:n) driver 1010 comprises a driver for each increment/step in the impedance sequence. Components in Z1(a:n) driver 1010 include Z1(a:n) comparator 1011, Z1(a:n) driver 1012 and Z1(a:n) inverted driver 1013. In other words, in this embodiment of control circuit 1000, if there are 10 steps there are ten drivers Z1(1) through Z1(10). The inputs to each Z1(a:n) comparator 1011 consist of slewed first impedance control signal V1s and a respective threshold Vth(a:n), which results in the output of each Z1(a:n) comparator providing a True output when slewed first impedance control signal V1s exceeds the respective threshold Vth(a:n). The output of Z1(a:n) comparator 1011 is driven by Z1(a:n) driver 1012 as first variable series impedance control Vs1 (a:n), which is provided to subcells ZS1a through Zs1n in first variable series impedance cell ZS1c, as shown in FIG.

9. The output of Z1(a:n) comparator 1011 is also driven by Z1(a:n) inverted driver 1013 as first variable shunt impedance control Vp1(a:n), which is provided to subcells Zp1a through Zp1n in first variable shunt impedance cell ZP1c, as shown in FIG. 9.

Z2(a:n) driver 1015 comprises a driver for each increment/step in the impedance sequence. Components in Z2(a:n) driver 1015 include Z2(a:n) comparator 1016, Z2(a:n) driver 1017 and Z2(a:n) inverted driver 1018. The inputs to each Z2(a:n) comparator 1012 consist of slewed second impedance control signal V2s and a respective threshold Vth(a:n), which results in the output of each Z2(a:n) comparator providing a True output when slewed second impedance control signal V2s exceeds the respective threshold Vth(a:n). The output of Z2(a:n) comparator 1016 is driven by Z2(a:n) driver 1017 as second variable series impedance control Vp1(a:n), which is provided to subcells ZP1a through ZP1n in second variable series impedance cell ZS2c, as shown in FIG. 9. The output of Z2(a:n) comparator 1016 is also driven by Z2(a:n) inverted driver 1018 as second variable shunt impedance control Vp2(a:n), which is provided to subcells Zp2a through Zp2n in second variable shunt impedance cell ZP2c, as shown in FIG. 9.

Z3(a:n) driver 1020 comprises a driver for each increment/step in the impedance sequence. Components in Z3(a:n) driver 1020 include Z3(a:n) comparator 1021 and Z3(a:n) driver 1022. The inputs to each Z3(a:n) comparator 1021 consist of slewed third impedance control signal V3s and a respective threshold Vth(a:n), which results in the output of each Z3(a:n) comparator providing a True output when slewed third impedance control signal V3s exceeds the respective threshold Vth(a:n). The output of Z3(a:n) comparator 1021 is driven by Z3(a:n) driver 1021 as third variable shunt impedance control Vp3(a:n), which is provided to subcells Zp3a through Zp3n in third variable shunt impedance cell ZP3c, as shown in FIG. 9.

Figure 11:
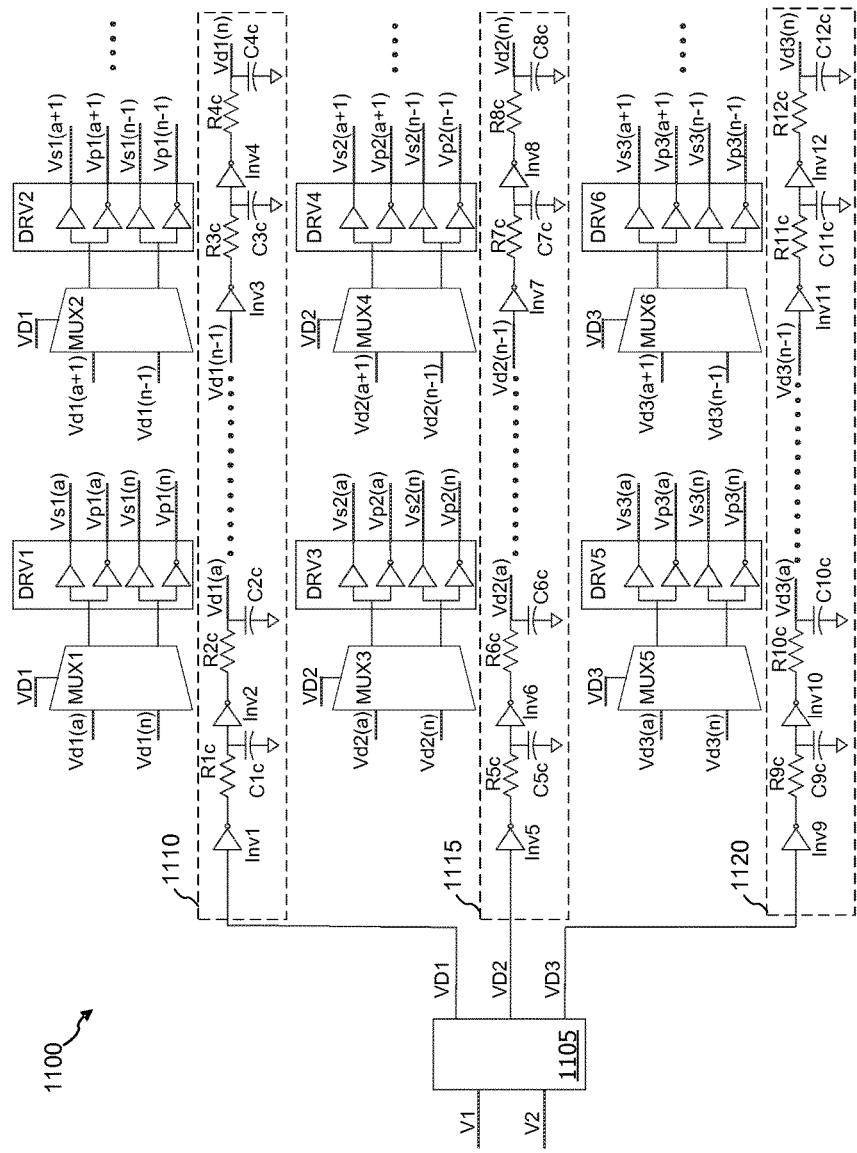
FIG. 11 illustrates an example implementation of a control circuit to control a sequenced constant impedance switch.

FIG. 11 illustrates an example implementation of a control circuit to control a sequenced constant impedance switch. Control circuit 1100 presents one of many possible embodiments to control cells, subcells and elements to provide impedance sequences for state transitions. Control circuit 1100 may be used to control the exemplary constant impedance switch in FIG. 7, among other embodiments with appropriate scaling.

Control circuit 1100 comprises decoder 1105, first, second and third sequence timing 1110, 1115, 1120, first through sixth multiplexer MUX1-6 and first through sixth drivers DRV1-6. As indicated in FIG. 11 by ellipses, a portion of control circuit 1100 may be omitted. The portion missing depends on the number of steps in a sequence.

Decoder 1105 receives state or state transition information in switch control signals V1 and V2, which may be provided, for example, by a switch controller or processor executing instructions. Decoder 1105 decodes switch control signals V1, V2 into first, second and third impedance control signals VD1, VD2 and VD3. First impedance control signal VD1 is provided to first sequence timing 1110, second impedance control signal VD2 is provided to second impedance timing 1115 and third impedance control signal VD3 is provided to third impedance timing 1120.

First impedance timing 1110 creates a first impedance sequence of control signals Vd1(a)-(n) from first impedance control signal VD1. First impedance timing 1110 creates a timing delay between each control signal in first impedance sequence of control signals Vd1(a)-(n). In this embodiment, the delay is created by a pair of inverters (i.e. a buffer) and a pair of RC circuits. For example, the delay between first impedance control signal VD1 and beginning first impedance sequence control signal Vd1(a) is created by first inverter Inv1, first RC pair R1c, C1c, second inverter Inv2 and second RC pair R2c, C2c and so on. The final delay between the second to last first impedance sequence control signal Vd1(n−1) and the last first impedance sequence control signal Vd1(n) is created by third inverter Inv2, third RC pair R3c, C3c, fourth inverter Inv4 and fourth RC pair R4c, C4c.

Second impedance timing 1115 creates a second impedance sequence of control signals Vd2(a)-(n) from second impedance control signal VD2. Second impedance timing 1115 creates a timing delay between each control signal in second impedance sequence of control signals Vd2(a)-(n). In this embodiment, the delay is created by a pair of inverters (i.e. a buffer) and a pair of RC circuits. For example, the delay between second impedance control signal VD2 and beginning second impedance sequence control signal Vd2(a) is created by fifth inverter Inv5, fifth RC pair R5c, C5c, sixth inverter Inv6 and sixth RC pair R6c, C6c and so on. The final delay between the second to last second impedance sequence control signal Vd2(n−1) and the last second impedance sequence control signal Vd2(n) is created by seventh inverter Inv7, seventh RC pair R7c, C7c, eight inverter Inv8 and eighth RC pair Rbc, C8c.

Third impedance timing 1115 creates a third impedance sequence of control signals Vd3(a)-(n) from first impedance control signal VD3. Third impedance timing 1120 creates a timing delay between each control signal in the third impedance sequence of control signals Vd3(a)-(n). In this embodiment, the delay is created by a pair of inverters (i.e. a buffer) and a pair of RC circuits. For example, the delay between third impedance control signal VD3 and beginning third impedance sequence control signal Vd3(a) is created by ninth inverter Inv9, ninth RC pair R9c, C9c, tenth inverter Inv10 and tenth RC pair R10c, C10c and so on. The final delay between the second to last third impedance sequence control signal Vd3(n−1) and the last third impedance sequence control signal Vd3(n) is created by eleventh inverter Inv11, eleventh RC pair R11c, C11c, twelfth inverter Inv12 and twelfth RC pair R12c, C12c.

The timing delay between each control signal in first, second and third impedance sequences of control signals Vd1(a)-(n), Vd2(a)-(n) and Vd3(a)-(n) may be uniform or nonuniform. One or both resistor and capacitor in one or more RC pairs may be tunable to adjust delays between impedance sequence transitions, e.g. for correction or calibration in accordance with variations in process, temperature and voltage. Variable resistors and/or variable capacitors may be adjusted to adjust delays between impedance sequence transitions. In some embodiments, the respective values of resistors and capacitors in each RC pair may be unit values, i.e., the same value. It is notable that use of terms beginning, last, and terms in-between refer to a unidirectional sequence. In some embodiments, including the present one, sequences may be bi-directional, such that beginning and last may be reversed.

In the embodiment illustrated in FIG. 11, first, second and third impedance sequence control signals Vd1(a)-(n), Vd2(a)-(n) and Vd3(a)-(n) are provided as selectable inputs to multiplexers. More specifically, at least in this embodiment, the output of every other inverter, i.e. buffer, is an input to a multiplexer. The selected outputs of each multiplexer are provided as inputs to drivers. The impedance sequence control signals provide forward and reverse sequences to substantially maintain constant impedance for a plurality of switch events.

More specifically, first and second multiplexers MUX1, MUX2 receive first impedance sequence of control signals Vd1(a)-(n), third and fourth multiplexers MUX3, MUX4 receive second impedance sequence of control signals Vd2(a)-(n) and fifth and sixth multiplexers MUX5, MUX6 receive third impedance sequence of control signals Vd3(a)-(n). As indicated by ellipses, there may be additional multiplexers and drivers depending on the number of steps in the sequence. For example, if there are 10 steps in a sequence there are thirty multiplexers and drivers instead of six shown in FIG. 11, which only shows the first two for each set of impedances being controlled in the embodiment shown in FIG. 9.

As shown in this embodiment, first multiplexer MUX1 receives beginning first impedance sequence control signal Vd1(a) and last first impedance sequence control signal Vd1(n). First impedance control signal VD1 selects one of these impedance sequence control signals to activate or deactivate series and shunt unit impedances in the first step in a sequence for first variable series impedance cell ZS1c and first variable shunt impedance cell ZP1c depending on the switch event. As previously indicated, a switch event may call for a forward sequence or a reverse sequence.

First driver DRV1 drives the output of first multiplexer MUX1 as a pair of impedance control signals. In a forward sequence, first driver DRV1 drives a pair comprising first variable series impedance control Vs1(a) and first variable shunt impedance control Vp1(a), where first variable shunt impedance control Vp1(a) is inverted. In a reverse sequence, first driver DRV1 outputs a pair comprising first variable series impedance control Vs1(n) and first variable shunt impedance control Vp1(n), where first variable shunt impedance control Vp1(n) is inverted.

Second multiplexer MUX2 receives the next first impedance sequence control signal Vd1(a+1) and second to last first impedance sequence control signal Vd1(n-1). First impedance control signal VD1 selects one of these impedance sequence control signals to activate or deactivate series and shunt unit impedances in the second step in a sequence for first variable series impedance cell ZS1c and first variable shunt impedance cell ZP1c depending on the switch event calling for a forward or reverse sequence.

Second driver DRV2 drives the output of second multiplexer MUX2 as a pair of impedance control signals. In a forward sequence, second driver DRV2 drives a pair comprising next first variable series impedance control Vs1(a+1) and next first variable shunt impedance control Vp1(a+1), where next first variable shunt impedance control Vp1(a+1) is inverted. In a reverse sequence, second driver DRV2 outputs a pair comprising second to last first variable series impedance control Vs1(n-1) and second to last first variable shunt impedance control Vp1(n-1), where second to last first variable shunt impedance control Vp1(n-1) is inverted. As indicated, there may be additional multiplexers and drivers depending on the number of steps in the impedance sequence.

Third multiplexer MUX3 receives beginning second impedance sequence control signal Vd2(a) and last second impedance sequence control signal Vd2(n). Second impedance control signal VD2 selects one of these impedance sequence control signals to activate or deactivate series and shunt unit impedances in the first step in a sequence for second variable series impedance cell ZS2c and second variable shunt impedance cell ZP2c depending on the switch event. As previously indicated, a switch event may call for a forward sequence or a reverse sequence.

Third driver DRV3 drives the output of third multiplexer MUX3 as a pair of impedance control signals. In a forward sequence, third driver DRV3 drives a pair comprising second variable series impedance control Vs2(a) and second variable shunt impedance control Vp2(a), where second variable shunt impedance control Vp2(a) is inverted. In a reverse sequence, third driver DRV3 outputs a pair comprising second variable series impedance control Vs2(n) and second variable shunt impedance control Vp2(n), where second variable shunt impedance control Vp2(n) is inverted.

Fourth multiplexer MUX4 receives the next second impedance sequence control signal Vd2(a+1) and second to last second impedance sequence control signal Vd2(n-1). Second impedance control signal VD2 selects one of these impedance sequence control signals to activate or deactivate series and shunt unit impedances in the second step in a sequence for second variable series impedance cell ZS2c and second variable shunt impedance cell ZP2c depending on the switch event calling for a forward or reverse sequence.

Fourth driver DRV4 drives the output of fourth multiplexer MUX4 as a pair of impedance control signals. In a forward sequence, fourth driver DRV4 drives a pair comprising next second variable series impedance control Vs2(a+1) and next second variable shunt impedance control Vp2(a+1), where next second variable shunt impedance control Vp2(a+1) is inverted. In a reverse sequence, fourth driver DRV4 outputs a pair comprising second to last second variable series impedance control Vs2(n-1) and second to last second variable shunt impedance control Vp2(n-1), where second to last second variable shunt impedance control Vp2(n-1) is inverted. As indicated, there may be additional multiplexers and drivers depending on the number of steps in the impedance sequence.

Fifth multiplexer MUX5 receives beginning third impedance sequence control signal Vd3(a) and last third impedance sequence control signal Vd3(n). Third impedance control signal VD3 selects one of these impedance sequence control signals to activate or deactivate series and shunt unit impedances in the first step in a sequence for third variable series impedance cell ZS3c and third variable shunt impedance cell ZP3c depending on the switch event. Note that the embodiment in FIG. 4 does not have a third variable series impedance cell ZS3c. As previously indicated, a switch event may call for a forward sequence or a reverse sequence.

Fifth driver DRV5 drives the output of fifth multiplexer MUX5 as a pair of impedance control signals. In a forward sequence, fifth driver DRV5 drives a pair comprising third variable series impedance control Vs3(a) and third variable shunt impedance control Vp3(a), where third variable shunt impedance control Vp3(a) is inverted. In a reverse sequence, fifth driver DRV5 outputs a pair comprising third variable series impedance control Vs3(n) and third variable shunt impedance control Vp3(n), where third variable shunt impedance control Vp3(n) is inverted.

Sixth multiplexer MUX6 receives the next third impedance sequence control signal Vd3(a+1) and second to last third impedance sequence control signal Vd3(n-1). Third impedance control signal VD3 selects one of these impedance sequence control signals to activate or deactivate series and shunt unit impedances in the second step in a sequence for third variable series impedance cell ZS3c and third variable shunt impedance cell ZP3c depending on the switch event calling for a forward or reverse sequence.

Sixth driver DRV6 drives the output of sixth multiplexer MUX6 as a pair of impedance control signals. In a forward sequence, sixth driver DRV6 drives a pair comprising next third variable series impedance control Vs3($a+1$) and next third variable shunt impedance control Vp3($a+1$), where next third variable shunt impedance control Vp3($a+1$) is inverted. In a reverse sequence, sixth driver DRV6 outputs a pair comprising second to last third variable series impedance control Vs3($n-1$) and third variable shunt impedance control Vp3($n-1$), where second to last third variable shunt impedance control Vp3($n-1$) is inverted. As indicated, there may be additional multiplexers and drivers depending on the number of steps in the impedance sequence.

The outputs of first through sixth drivers, i.e., impedance control signals Vs1($a:n$), Vs2($a:n$), Vp1($a:n$), Vp2($a:n$) and Vp3($a:n$), are provided to respective subcells as shown in FIG. 4 to variously generate forward and reverse impedance sequences called for by particular switch events.

Figure 12:
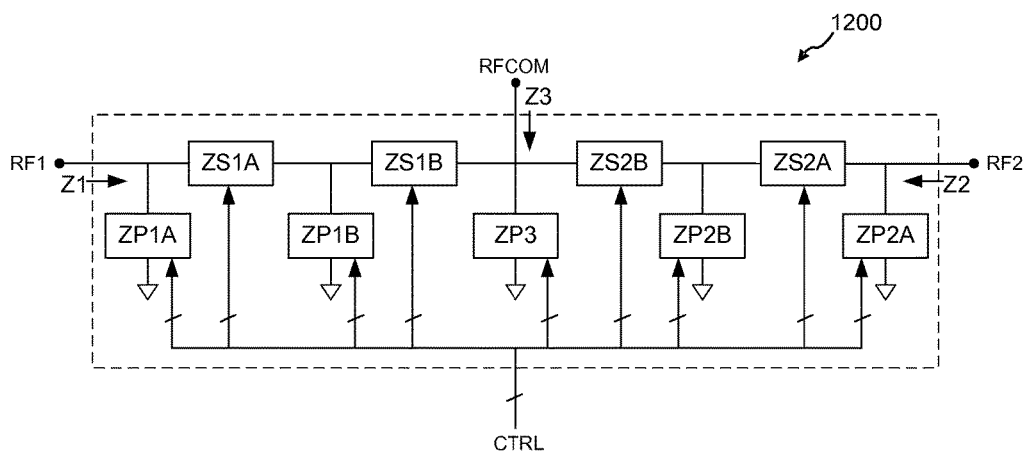
FIG. 12 illustrates an example of a sequenced constant impedance single pole double throw second order switch with a plurality of variable impedances configured to provide constant impedance.

FIG. 12 illustrates an example of a sequenced constant impedance single pole double throw second order switch with a plurality of variable impedances configured to provide constant impedance. Switch 1200 is a second order embodiment, as compared to the first order embodiment in FIG. 8. Switch 1200 may provide better isolation than switch 1300. The impedance of switch 1200 looking into first port RF1 is given by first port impedance Z1. The impedance of switch 1200 looking into second port RF2 is given by second port impedance Z2. The impedance of switch 1200 looking into third port RF3 is given by third port impedance Z3. A design and operation objective is to control each variable impedance ZS1A, ZP1A, ZS1B, ZP1B, ZS2A, ZP2A. ZS2B, ZP2B, ZP3 to substantially maintain each port impedance Z1, Z2 and Z3 at system characteristic impedance Zo during both static states and dynamic conditions (transitions) between states.

Determining how to control each impedance ZS1A, ZP1A, ZS1B, ZP1B, ZS2A, ZP2A. ZS2B, ZP2B, ZP3 to maintain impedance at each port RF1, RF2 and RFCOM requires impedance analyses to solve for variables. When characteristic impedance Zo is the same for each port RF1, RF2 and RFCOM, the number of static states and dynamic conditions may be reduced due to symmetry. Static states can be reduced to two states: an open (OFF) state and a path (either path) ON state. Dynamic conditions can also be reduced to two conditions: switching between an OFF state and a path ON state and switching between path ON states (i.e. from first path ON, second path OFF state to first path OFF, second path ON state and vice versa).

In a first dynamic condition when switching between an OFF state and a path ON state, one or the other of the first and second paths will be OFF, which means one of first set of variable series impedances Zs1$a$, Zs1$b$ in the first path and second set of variable impedances Zs2$a$, Zs2$b$ in the second path are deemed infinite (open circuit). For purposes of calculations, assume the first path is ON and the second path is OFF, which would mean for purposes of calculations that second set of variable series impedances Zs2$a$, Zs2$b$ are an ideal high impedance. With second set of variable series impedances Zs2$a$, Zs2$b$ open, second set of variable series impedances Zs2$a$, Zs2$b$ and second set of variable shunt impedances Zp2$a$, Zp2$b$ are irrelevant to the calculation of first and third port impedances Z1 and Z3. First port impedance Z1 is given by Equation 1:

$$Z_1 = \{[[(Z_{p3}||Z_o) + Z_{s1b}]||Z_{1pb}] + Z_{s1a}\}||Z_{p1a} \qquad \text{Equation 9}$$

When second set of variable series impedance Zs2$a$, Zs2$b$ are open, second port impedance Z2 equals characteristic impedance Zo. Thus, second port impedance Z2 is given by Equation 10:

$$Z_2 = Z_0 \qquad \text{Equation 10}$$

Given the remaining circuit comprising first set of variable series impedances Zs1$a$, Zs1$b$ and first set of variable shunt impedances Zp1$a$, Zp1$b$ and third variable shunt impedance Zp3, symmetry in this circuit means shunt impedances Zp1$a$ and Zp3 will be the same, as will first and third port impedances Z1 and Z3. Thus, third port impedance Z3 is given by Equation 11:

$$Z_3 = Z_1 \qquad \text{Equation 11}$$

Characteristic impedance Zo is known since it is defined by the system that switch 1100 is coupled to. Given that system characteristic impedance Zo is known, the remaining variables may be selected to maintain first and third port impedances Z1, Z3 at characteristic impedance Zo by solving Equation 9 as shown in Equation 12:

$$\begin{aligned}Z_{p1a}^2(Z_o^2 + Z_oZ_{s1b} - Z_{p1b}Z_{s1b} - Z_{p1b}Z_{s1a} - Z_oZ_{s1a} - \\ Z_{s1a}Z_{s1b}) + Z_{p1a}(Z_o^2Z_{p1b} + 2Z_o^2Z_{s1b} + Z_o^2Z_{p1b} + \\ Z_o^2Z_{s1a}) + (Z_o^2Z_{p1b}Z_{s1a} + 2Z_o^2Z_{s1a}Z_{s1b}) = 0\end{aligned} \qquad \text{Equation 12}$$

The quadratic formula in Equation 12 may be used to solve for first variable shunt impedance Zp1$a$ by selecting values for characteristic impedance Zo, first variable shunt impedance Zp1$b$ and first set of variable series impedances Zs1$a$ and Zs1$b$. The results found in this first dynamic condition may be used to solve equations in the second dynamic condition.

In the second dynamic condition when switching between path ON states (i.e. from first path ON, second path OFF state to first path OFF, second path ON state and vice versa), third variable shunt impedance Zp3 is infinite (open circuit). First port impedance Z1 is given by Equation 13, second port impedance Z2 is given by Equation 14 and third port impedance Z3 is given by Equation 15:

$$Z_1 = \{[((Z_o||Z_{p2a} + Z_{s2a})||Z_{p2b} + Z_{s2b})||Z_o||Z_{p3} + Z_{s1b}]||Z_{p1b} + Z_{s1a}\}||Z_{p1a} \qquad \text{Equation 13}$$

$$Z_2 = \{[((Z_o||Z_{p1a} + Z_{s1a})||Z_{p1b} + Z_{s1b})||Z_o||Z_{p3} + Z_{s2b}]||Z_{p2b}Z2b\}||Z_{p2b} \qquad \text{Equation 14}$$

$$Z_3 = [(Z_o||Z_{p1a} + Z_{s1a})||Z_{p1b} + Z_{s1b}]||[(Z_o||Z_{p2a} + Z_{s2a})||Z_{p2b} + Z_{s2b}]||Z_{p3} \qquad \text{Equation 15}$$

Equations 13-15 can be solved for any variable. In some embodiments, it may be desirable to ensure that the solutions for each transition utilize the same set of step values (albeit in different orders as needed to maintain port impedances) to minimize design, fabrication and operating costs. Other embodiments may employ different sets of step values for different transitions. However, for purposes of this embodiment, it will be presumed that the same set of step values will be used for all transitions (in different orders as needed to maintain port impedances). The results found in the first dynamic condition may be used to solve equations in the second dynamic condition. Characteristic impedance Zo is known (e.g. 50Ω) since it is defined by the system switch 1200 is coupled to.

Table 5 below shows a logarithmic step example to maintain first, second and third port impedances Z1, Z2, Z3 of switch 1100 substantially (e.g. +/−10%) at 50Ω during a transition from a first path ON state, second path OFF state to second path ON state, first path OFF state. In the embodiment shown in Table 5, the log base for the A group of variable impedances is 5.6, the log base for the B group of variable impedances is 4.2 and the static ON impedance is 2.4Ω combining the ON impedance of both series impedances in a path. The number of steps η is 5. A test frequency is 4 GHz. High impedance for A group of shunt impedances is 15,003Ω. High impedance for B group of shunt impedances is 7,490Ω. High impedance for A group series impedances is 2,601Ω. High impedance for B group of series impedances is 5,201Ω.

TABLE 5

Logarithmic Impedance Steps for Path 1 ON to Path 2 ON

| η | A x | B x | $Z_{p1a}$ | $Z_{s1a}$ | $Z_{p1b}$ | $Z_{s1b}$ | $Z_{s2b}$ | $Z_{p2b}$ | $Z_{s2a}$ | $Z_{p2a}$ |
|---|---|---|---|---|---|---|---|---|---|---|
|   |        |        | 110003 | 0.8    | 7489.6 | 1.6    | 10201.1 | 2.3  | 21100.6 | 51.5   |
| 1 | 5.6    | 4.2    | 668.5  | 4.5    | 716.9  | 6.7    | 497.9   | 9.7  | 786.8   | 54.7   |
| 2 | 31.4   | 17.6   | 158.8  | 25.1   | 170.7  | 28.2   | 118.5   | 40.6 | 140.5   | 73.9   |
| 3 | 175.6  | 74.1   | 73.9   | 140.5  | 40.6   | 118.5  | 28.2    | 170.7 | 25.1   | 158.8  |
| 4 | 983.4  | 311.2  | 54.7   | 786.8  | 9.7    | 497.9  | 6.7     | 716.9 | 4.5    | 668.5  |
| 5 | 5507.3 | 1306.9 | 41.5   | 21100.6 | 2.3   | 10201.1 | 1.6    | 7489.6 | 0.8   | 110003 |

The sets of step values (step sequences) in Table 5 are reusable for other state transitions of switch 1100 in the order justified by the transition. Due to symmetry, the step sequences may be reversed for reverse state transitions to maintain first, second and third port impedances Z1, Z2, Z3 of switch 1100 substantially at 50Ω. In the embodiment shown in Table 5, first, second and third port impedances Z1, Z2, Z3 were maintained at 49 to 52Ω during each transition, which is less than 5% variation.

Table 6 provides additional implementation details for the exemplary embodiment presented in FIG. 11 with respect to the sequences provided in Table 5 to transition from the path 1 ON, path 2 OFF state to the path 1 OFF, path 2 ON state. In this embodiment, the transistor stack height in every variable impedance is four, except the A group of series impedances, each of which had a stack height of two. The stack height reduction for the A group of series impedances nearest first and second ports RF1, RF2 may help reduce insertion loss while still being able to handle power and provide sufficient isolation. This embodiment was implemented as an absorptive switch with a 25Ω resistor in series with an inductor coupling each shunt cell or subcell to ground. The corner frequency $f_o$ is 2 MHz and unit Oxide capacitance is 1.84 pF/mm. Resulting switch time is 1200 ns and VSWR is 1.26:1 to 1.38:1 depending on which port is being driven and the state transition. Of course, other embodiments may have the same or different parameters and results. The switching speed is given by an RC time constant in Equation 8. As with Table 4, Table 6 shows the width of transistors that are being turned ON or turned OFF in their respective sequences. A sequence of widths that begins with OFF lists transistors having those widths being turned ON in the order provided while a sequence that ends with OFF lists transistors having those widths being turned OFF in the order provided.

subcells or elements being on or off at the end of a sequence, other embodiments may employ the same or different configurations of cells, subcells, elements and coding to control impedance sequencing during switching. Accomplishing the sequence of impedance steps may be accomplished by many different configurations of elements, subcells and cells. In other embodiments, cells, subcells and elements may be configured for and controlled by thermometer, binary, hybrid or other coding techniques to assemble and disassemble impedances in each step of a sequence. Impedances may be the same or different in each cell and/or subcell.

The foregoing equations for a multi-order constant impedance switch, actually any set of equations for a particular constant impedance switch, can be solved by a switch design calculator, which may be implemented as software instructions stored on a computer-readable storage medium and executed by a computer processor. Such a calculator can simultaneously, including iteratively, solve (e.g. try to find an optimal value) for each variable impedance based on a selected design parameters provided to the calculator, such as one or more of impedance step range, resolution, switch time, impedance type or implementation, number of steps, characteristic impedance, log base, insertion loss, isolation. The calculator can solve for one, several or all state transitions for a particular switch.

There are numerous advantages to substantially maintaining first, second and port impedances Z1, Z2, Z3 at characteristic impedance Zo during each of its transitions. By maintaining switch impedance during transitions, VSWR remains at or near 1:1, impedance spikes and reflections are eliminated, switching time may be reduced, operations can continue without delay and there is no need to design, fabricate and operate complex circuitry and programming to contend with impedance spikes and reflections.

Figure 13:
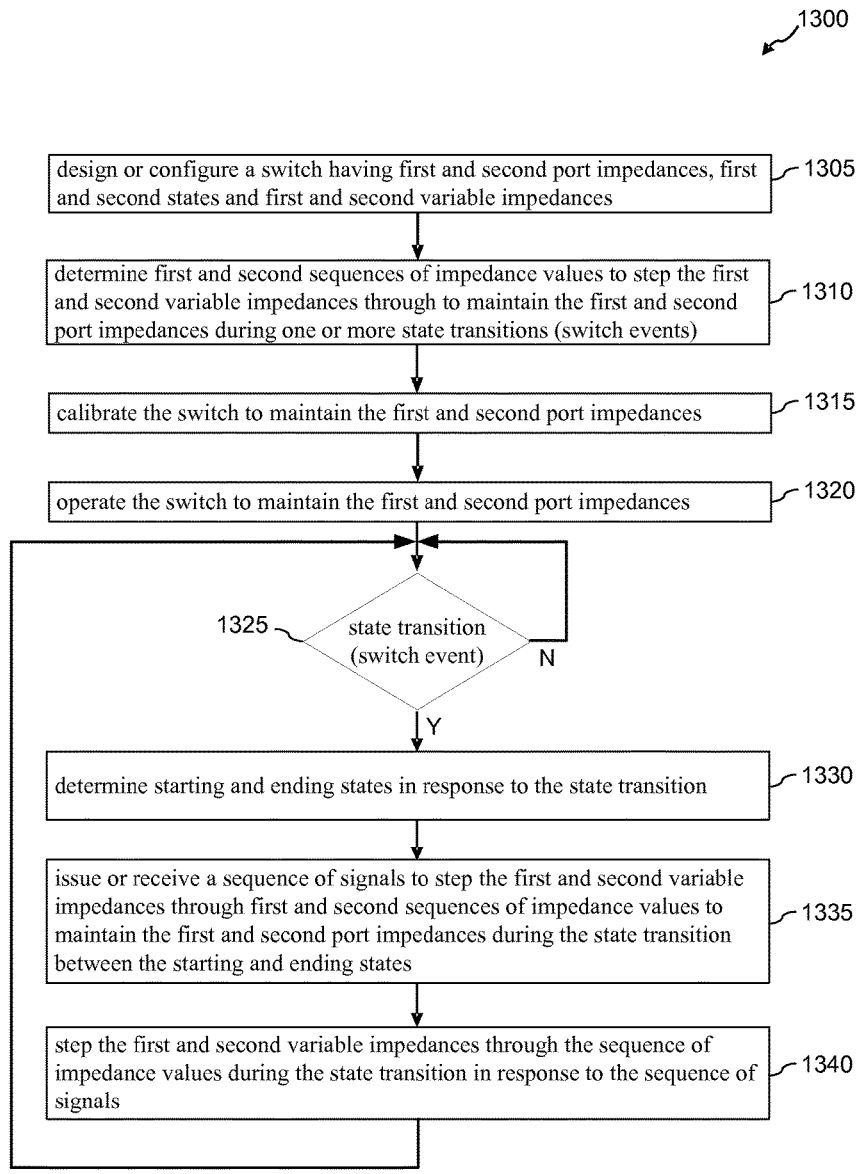
FIG. 13 illustrates an example of a method of mitigating variation in switch impedance, maintaining switch impedance during a switch transition by stepping the switch through a sequence of different states from a start state to at least one intermediate state to an end state.

Sequenced switching may be implemented as methods. An example of a method is illustrated in FIG. 13. FIG. 13 illustrates an example of a method of mitigating variation in switch impedance, maintaining switch impedance during a

TABLE 6

Subcell Design for Logarithmic Impedance Step for Path 1 ON to Path 2 ON

| η | $W_{pa}$(mm) | $R_{Gpa}$(Ω) | $W_{sa}$(mm) | $R_{Gsa}$(Ω) | $W_{pb}$(mm) | $R_{Gpb}$(Ω) | $W_{sb}$(mm) | $R_{Gsb}$(Ω) |
|---|---|---|---|---|---|---|---|---|
|   | OFF     |           | 1.47857 | 29,250    | OFF     |            | 1.37143 | 31,535    |
| 1 | 0.00448 | 9,662,706 | 0.26403 | 163,802   | 0.00402 | 10,766,126 | 0.32653 | 132,449   |
| 2 | 0.01704 | 2,537,471 | 0.041215 | 917,289  | 0.01285 | 3,364,414  | 0.07775 | 556,285   |
| 3 | 0.03742 | 1,155,687 | 0.00842 | 5,136,817 | 0.05399 | 801,051    | 0.01851 | 2,336,399 |
| 4 | 0.031305 | 1,136,703 | 0.00128 | 33,878,1340 | 0.22576 | 190,725  | 0.00523 | 8,267,909 |
| 5 | 0.01189 | 3,637,355 | OFF     |           | 0.95238 | 45,411     | OFF     |           |

While the configuration of switch 1200 and sequences in Table 6 permit sequence control such that one subcell or element is turned on or off in each step, resulting in all switch transition by stepping the switch through a sequence of different states from a start state to at least one intermediate state to an end state. No order of steps is required unless expressly indicated or inherently required. There is no requirement that an embodiment implement all of the steps illustrated in FIG. 13. FIG. 13 is simply one of many possible embodiments. Embodiments may implement fewer, more or different steps.

Method 1300 comprises step 1305, designing or configuring a switch having first and second port impedances, first and second states and first and second variable impedances. For example, as shown and discussed with respect to FIGS. 6-8, a designer or fabricator would select switch parameters based on specifications, such as the number of poles, throws, power, operating frequency, isolation, insertion loss, types of impedance elements, etc.

Method 1300 further comprises step 1310, determining first and second sequences of impedance values to step the first and second variable impedances through to maintain the first and second port impedances during one or more state transitions. For example, as shown and discussed with respect to FIGS. 8-11 and Tables 1-6, a designer would determine and a manufacturer and/or end-user would configure variable impedance sequences to substantially maintain port impedances at characteristic impedances during one or more transitions.

Method 1300 further comprises step 1315, calibrate the switch to maintain the first and second port impedances. For example, as shown and discussed with respect to FIG. 10, a manufacturer or end-user may calibrate a constant impedance switch. One of many possible calibration techniques comprises calibrating the RC time constant that slews impedance control signals. Another calibration technique comprises calibrating thresholds. Calibration may be done manually or automatically by a manufacturer, an end user, a switch control circuit, software, etc.

Method 1300 further comprises step 1320, operating the switch to maintain the first and second port impedances. For example, step 1320 may be implemented by operating control circuit 1000 and switch 900 in accordance with steps 1325-1340.

Method 1300 further comprises step 1325, determining whether there is a state transition (switch event). For example, logic in decoder 1005 determines whether first and second switch control signals V1, V2 indicate switch 900 is transitioning between states. If not, then switch control 1000 waits for a state transition by looping step 1325. If there is a state transition, then method 1300 proceeds to step 1330

Method 1300 further comprises step 1330, determining starting and ending states in response to the state transition. For example, first and second switch control signals V1, V2 may indicate a state or a transition between states. If first and second switch control signals V1, V2 indicate a state then decoder 1005 may store previous/existing states and determine a state transition by comparison to a state indicated by first and second switch control signals V1, V2. The starting and ending states may result in different sets of impedance control signals V1, V2, V3.

Method 1300 further comprises step 1335, issuing or receiving a sequence of signals to step the first and second variable impedances through first and second sequences of impedance values to maintain the first and second port impedances during the state transition between the starting and ending states. For example, Z1, Z2 and Z3 drivers in control circuit 1000 may issue and switch 900 may receive a sequence of signals Vs1a-Vs1n, Vp1a-Vp1n, Vs2a-Vs2n, Vp2a-Vp2n, Vp2a-Vp3n to step respective variable impedance cells or subcells therein, such as first variable series impedance cell Zs1c, first variable shunt impedance cell Zp1c, second variable series impedance cell Zs2c, second variable shunt impedance cell Zp2c and third variable shunt impedance cell Zp3c.

Method 1300 further comprises step 1340, stepping the first and second variable impedances through the sequence of impedance values during the state transition in response to the sequence of signals. For example, in response to switch 900 receiving a sequence of signals Vs1a-Vs1n, Vp1a-Vp1n, Vs2a-Vs2n, Vp2a-Vp2n, Vp2a-Vp3n, subcells in first variable series impedance cell Zs1c, first variable shunt impedance cell Zp1c, second variable series impedance cell Zs2c, second variable shunt impedance cell Zp2c and/or third variable shunt impedance cell Zp3c step these variable impedance cells through sequences of impedance values, such as those shown in Tables 2, 3 and 4. At the end of step 1340, method 1300 returns to step 1325 to await another state transition.

Methods and apparatuses have been disclosed for mitigating impedance variation during switch events by sequenced switching. A sequenced switch may be stepped incrementally through a sequence of different states from a start state to at least one intermediate state to an end state. Various architectures, sequencing and step control techniques may permit any degree of mitigation, including to the point of essentially eliminating impedance glitches. Switch components, e.g., switch and/or impedance elements, may be sequenced during switch events to dynamically manage switch impedance. Sequential reconfiguration of the structure and/or parameters of one or more switch branches may permit simplification of related programming and circuitry while increasing the lifespan of components spared from unmitigated current and voltage spikes. Each switch branch being transitioned during a switch event may sequence differently than other branches based on switch and branch start and end states. Switch impedance variations may be mitigated for single and multi-throw switches having variable impedances of any order. Each switch or branch element may be fixed or variable. Each switch or branch element may comprise one or more configurable transistor cells, subcells or elements controlled by thermometer, binary, hybrid or other coding technique.

There are performance advantages provided by embodiments of the disclosed technology relative to conventional technology. For example, without limitation, by maintaining switch impedance during transitions, VSWR remains at or near 1:1, impedance spikes and reflections are eliminated or substantially reduced, switching time may be maintained or reduced, operations can continue without delay and there is no need to design, fabricate and operate complex circuitry and programming to contend with impedance spikes and reflections.

Proper interpretation of subject matter described herein and claimed hereunder is limited to patentable subject matter under 35 U.S.C. § 101. Subject matter described in and claimed based on this patent application is not intended to and does not encompass unpatentable subject matter. As described herein and claimed hereunder, a method is a process defined by 35 U.S.C. § 101. As described herein and claimed hereunder, each of a circuit, device, apparatus, machine, system, computer, module, media and the like is a machine and/or manufacture defined by 35 U.S.C. § 101.

A device (i.e., apparatus), as defined herein, is a machine or manufacture as defined by 35 U.S.C. § 101. A device may comprise, for example but not limited to, a switch or any device having a switch, e.g., an amplifier, attenuator, digital step attenuator, intermediate frequency (IF) device, radio frequency (RF) device, wireless device, communications device, radio system, receiver, transmitter, transceiver, cellular base station equipment and other communications and wireless infrastructure equipment, etc. For example, embodiments of the disclosed subject matter may be implemented in one or more IF and RF stages of receivers, transmitters and transceivers. Devices may be digital, analog or a combination thereof. Digital devices may have one or a plurality of programming modes, e.g., serial, parallel, latched parallel, for a plurality of different programming and control implementations.

Devices may be digital, analog or a combination thereof. Devices may be implemented with any one or more semiconductor processes or semiconductor technology, including one or more of BJT, HBT, MOSFET, MESFET, CMOS, BiCMOS or other transconductor or transistor technology. Implementation with different technologies may require alternative configurations other than the configuration illustrated in embodiments presented herein, which is within the knowledge of one of ordinary skill. Devices may be implemented in any discrete or integrated circuit fabrication technology, including but not limited to Silicon-Germanium (SiGe) semiconductors or other semiconductors comprising other materials and alloys.

Techniques described herein may be implemented in hardware (digital and/or analog) or a combination of hardware, software and/or firmware. Techniques described herein may be implemented in one or more components. Embodiments of the disclosed subject matter may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media.

Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to FIGS. 1-13, as well as any and all components, steps and functions therein and/or further embodiments of the present technology described herein.

While the disclosed technology has been described with respect to a limited number of embodiments, it should be understood that they have been presented by way of example only, and not limitation. It will be understood by those skilled in the relevant art(s) that the spirit and scope of the subject matter of the present application encompasses a wide variety of implementations, including various changes in form and details to disclosed embodiments.

Embodiments are not limited to the functional blocks, detailed examples, steps, order or the entirety of subject matter presented in the figures, which is why the figures are referred to as exemplary embodiments. An embodiment in a device, apparatus or machine may comprise any one or more features described herein in any configuration. An embodiment in a method may comprise any process described herein, in any order, with any number of steps, using any modality.

The exemplary appended claims encompass embodiments and features described herein, modifications and variations thereto as well as additional embodiments and features that fall within the true spirit and scope of the disclosed subject matter.

What is claimed:

1. A device comprising:
   a switch configured to mitigate variation in switch impedance during a switch transition from a start state to an end state by stepping the switch a plurality of times through a sequence of steps during the switch transition that step the switch through a sequence of different states from the start state to at least one intermediate state to the end state, wherein the start and end states are static states of the switch and the at least one intermediate state is at least one non-static transitional state of the switch.

2. The device of claim 1, wherein the at least one intermediate state comprises a first intermediate state and a second intermediate state.

3. The device of claim 1, the switch comprising a first branch and a second branch, wherein stepping the switch through the sequence of different states from the start state to the at least one intermediate state to the end state comprises:
   stepping the first branch through a first branch sequence of different states from a first branch start state to at least one first branch intermediate state to a first branch end state; and
   stepping the second branch through a second branch sequence of different states from a second branch start state to at least one second branch intermediate state to a second branch end state.

4. The device of claim 3, wherein the second branch sequence is a reverse order of the first branch sequence.

5. The device of claim 1, wherein at least one of the step from the start state to the at least one intermediate state and the step from the at least one intermediate state to the end state comprises a reconfiguration of the switch.

6. The device of claim 5, the switch comprising a plurality of switch elements, wherein the reconfiguration of the switch comprises at least one of opening and closing at least one of the plurality of switch elements.

7. The device of claim 6, the switch comprising a first branch selectable to couple a first input to a first output of the switch, the plurality of switch elements comprising at least one series switch and at least one shunt switch in the first branch.

8. The device of claim 7, wherein the at least one series switch comprises a first series switch and a second series switch between the first input and the first output and the at least one shunt switch comprises a first shunt switch in a first shunt path and a second shunt switch in a second shunt path.

9. The device of claim 8, the at least one intermediate state comprising a first intermediate state and a second intermediate state, wherein the switch is configured for a first transition from a first start state to a first end state as follows:
   the first start state comprises the first branch configured with the first and second shunt switches closed and the first and second series switches open;

the first intermediate state comprises the first branch configured with the first shunt switch open, the second shunt switch closed and the first and second series switches open;

the second intermediate state comprises the first branch configured with the first shunt switch open, the second shunt switch closed and the first and second series switches closed; and the first end state comprises the first branch configured with the first and second shunt switches open and the first and second series switches closed.

10. The device of claim 6, wherein the switch is configured for a second transition from a second start state to a second end state comprising a reverse order of states in claim 9.

11. A method comprising:

mitigating variation in switch impedance during a switch transition from a start state to an end state by:

stepping the switch a plurality of times through a sequence of steps during the switch transition that step the switch through a sequence of different states from the start state to at least one intermediate state to the end state, wherein the start and end states are static states of the switch and the at least one intermediate state is at least one non-static transitional state of the switch.

12. The method of claim 11, further comprising:

receiving a control signal; and generating from the control signal a first sequence of switch control signals for a first switch transition that steps the switch through a first sequence of different states from a first start state to at least one intermediate state to a first end state.

13. The method of claim 12, further comprising:

generating a second sequence of switch control signals for a second switch transition that steps the switch through a second sequence of different states from a second start state to at least one intermediate state to a second end state by:

selecting a different order of switch control signals for the first sequence of switch control signals.

14. The method of claim 11, wherein stepping the switch through a sequence of different states from the start state to at least one intermediate state to the end state comprises:

stepping the switch from the start state to a first intermediate state;

stepping the switch from the first intermediate state to a second intermediate state; and stepping the switch from the second intermediate state to the end state.

15. The method of claim 11, the switch comprising a first branch and a second branch, wherein stepping the switch through a sequence of different states from the start state to at least one intermediate state to the end state comprises:

stepping the first branch through a first branch sequence of different states from a first branch start state to at least one first branch intermediate state to a first branch end state; and stepping, the second branch through a second branch sequence of different states from a second branch start state to at least one second branch intermediate state to a second branch end state.

16. The method of claim 15, wherein a first step in the first branch sequence switches a first load impedance into the first branch and wherein a final step in the second branch sequence switches a second load impedance out of the second branch.

17. The method of claim 16, wherein the switch transition comprises selecting the second branch and deselecting the first branch.

18. A device comprising:

a switch controller configured to mitigate variation in switch impedance during a switch transition from a start state to an end state by stepping the switch a plurality of times through a sequence of steps during the switch transition that step the switch through a sequence of different states from the start state to at least one intermediate state to the end state, wherein the start and end states are static states of the switch and the at least one intermediate state is at least one non-static transitional state of the switch.

19. The device of claim 18, the switch controller comprising a first branch controller, wherein, for the switch transition, the first branch controller is configured to transition a first branch of the switch between a selected (ON) state and a deselected (OFF) state by stepping the first branch of the switch through a sequence of different states from a first branch start state to at least one first branch intermediate state to a first branch end state.

20. The device of claim 18, wherein the first branch controller is configured to transition the first branch of the switch from ON to OFF states with at least one intermediate state and from OFF to ON states with at least one intermediate state in response to a one bit control signal.

* * * * *